(12) United States Patent
Kobayashi

(10) Patent No.: US 8,704,598 B2
(45) Date of Patent: Apr. 22, 2014

(54) LINEAR FET FEEDBACK AMPLIFIER

(71) Applicant: RF Micro Devices, Inc., Greensboro, NC (US)

(72) Inventor: Kevin Wesley Kobayashi, Torrance, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/748,735

(22) Filed: Jan. 24, 2013

(65) Prior Publication Data

US 2013/0137383 A1 May 30, 2013

Related U.S. Application Data

(63) Continuation-in-part of application No. 13/099,636, filed on May 3, 2011, now Pat. No. 8,390,380.

(60) Provisional application No. 61/349,653, filed on May 28, 2010.

(51) Int. Cl.
 *H03F 1/34* (2006.01)
(52) U.S. Cl.
 USPC ............................................ 330/294; 330/296
(58) Field of Classification Search
 USPC .................... 330/294, 98, 150, 285, 296
 See application file for complete search history.

(56) References Cited

U.S. PATENT DOCUMENTS

| | | | | |
|---|---|---|---|---|
| 4,490,693 | A * | 12/1984 | Behrend | 333/28 R |
| 5,047,731 | A * | 9/1991 | Lee | 330/282 |
| 5,264,806 | A * | 11/1993 | Kobayashi | 330/294 |
| 6,927,634 | B1 | 8/2005 | Kobayashi | |
| 6,933,787 | B1 | 8/2005 | Kobayashi | |
| 6,972,630 | B2 * | 12/2005 | Kobayashi | 330/296 |
| 7,772,927 | B1 | 8/2010 | Shealy et al. | |
| 2003/0155977 | A1 * | 8/2003 | Johnson et al. | 330/290 |

OTHER PUBLICATIONS

Kobayashi, K.W., "Improved efficiency, IP3-bandwidth and robustness of a microwave Darlington amplifier using 0.5μm ED PHEMT and a new circuit topology," 2005 IEEE Compound Semiconductor Integrated Circuit Symposium, Oct. 30-Nov. 2, 2005, pp. 93-96.
Kobayashi, K.W "High Linearity-Wideband PHEMT Darlington Amplifier with +40 dBm IP3," 2006 Asia-Pacific Microwave Conference, Dec. 12-15, 2006, pp. 1035-1038.
Kobayashi, K.W., "A Novel E-mode PHEMT Linearized Darlington Cascode Amplifier," 2006 IEEE Compound Semiconductor Integrated Circuit Symposium, Nov. 2006, pp. 153-156.

(Continued)

*Primary Examiner* — Henry Choe
(74) *Attorney, Agent, or Firm* — Withrow & Terranova, P.L.L.C.

(57) ABSTRACT

A circuit that includes a Darlington transistor pair having an input transistor and an output transistor configured to generate an output signal at an output node in response to an input signal received through the input node is disclosed. The circuit has a resistor-inductor-capacitor (RLC) type frequency bias feedback network communicatively coupled between the output transistor and the input node for providing biasing to the Darlington transistor pair as well as for adjusting at least one characteristic of an amplified version of the input signal that passes through the input transistor and into the frequency bias network. The circuit further includes a feedback coupling network coupled between the output node and the input node for feeding back to the input node a portion of the amplified version of the input signal that passes through the input transistor.

37 Claims, 26 Drawing Sheets

(56) References Cited

OTHER PUBLICATIONS

Sirenza Microdevices, "Standard 5 V Medium Power InGaP Darlington Amplifiers," Microwave Journal, vol. 48, No. 5, Apr. 2005, 3 pages, Horizon House Publications, Inc.

Non-Final Office Action for U.S. Appl. No. 13/099,636, mailed May 18, 2012, 5 pages.
Final Office Action for U.S. Appl. No. 13/099,636, mailed Aug. 21, 2012, 5 pages.
Notice of Allowance for U.S. Appl. No. 13/099,636, mailed Nov. 1, 2012, 6 pages.

* cited by examiner

LINEAR FET FEEDBACK AMPLIFIER

RELATED APPLICATIONS

This application is a continuation-in-part of U.S. patent application Ser. No. 13/099,636, filed May 3, 2011, now U.S. Pat. No. 8,390,380, which claims the benefit of U.S. Provisional Patent Application No. 61/349,653, filed May 28, 2010, the disclosures of which are incorporated herein by reference in their entirety.

FIELD OF THE DISCLOSURE

The present disclosure relates to radio frequency (RF) feedback amplifiers and in particular to a Darlington field effect transistor (FET) feedback amplifier.

BACKGROUND

Wideband Darlington amplifiers with high linearity are standard radio frequency (RF) building blocks for wireless, cable television (CATV), fiber optics, and general purpose RF applications. An important attribute for such applications are high linearity over multi-decade bandwidth operation. One figure of merit for weakly nonlinear systems such as small signal RF amplifiers is known as a third order intercept point (IP3). A relatively high value for IP3 measured in decibels referenced to one milliwatt (dBm) indicates a relatively high linearity for a device or system, whereas a relatively low value for IP3 indicates a relatively low linearity for a device or system. A low linearity for an RF device such as an amplifier or mixer will cause inter-modulation (IM) products to be generated that cannot be filtered out before reaching a receiver.

Darlington amplifiers based upon Indium Gallium Phosphide (InGaP) heterojunction bipolar transistors (HBTs) have demonstrated some of the highest IP3-bandwidth (IP3-BW) values for an RF Darlington feedback amplifier. FIG. 1 is a circuit diagram of a simple embodiment of a prior art self-biased Darlington feedback topology. In particular, the self-biased Darlington feedback amplifier 10 depicted in FIG. 1 includes features disclosed in U.S. Pat. No. 6,972,630 and U.S. Pat. No. 6,927,634, both of which are entitled "Self-Biased Darlington Amplifier", both of which are incorporated herein by reference in their entirety. Moreover, the self-biased Darlington feedback amplifier 10 has been implemented using Silicon Germanium (SiGe) and Indium Gallium Phosphide (InGaP) heterojunction bipolar transistor technologies as well as enhancement mode (E-mode) pseudomorphic high electron mobility transistor (PHEMT) technology. Robust operation over temperature and process variation is a key advantage of the self-biased Darlington feedback amplifier 10. Moreover, the self-biased Darlington feedback amplifier 10 eliminates the need for an off-chip active bias network such as a positive-negative-positive (PNP) transistor network. Further still, the self-biased Darlington feedback amplifier 10 provides inherent benefits of an intermediate frequency (IF) or beat tone cancellation through negative feedback. The self-biased Darlington feedback amplifier 10 also includes a unique ability of enabling class B biasing, which is not possible with traditional Darlington feedback amplifiers that use a resistive bias network that restrict traditional Darlington amplifiers to class A operation.

In particular, the self-biased Darlington feedback amplifier 10 illustrates a basic embodiment prior art self-biased Darlington feedback topology. A main amplifier section 12 may be implemented with a transistor Q1 and a transistor Q2. A bias section (or circuit) 14 is generally connected between the emitter and base of the transistor Q1. The bias section 14 is implemented as a self-biased feedback circuit. The self-biased Darlington feedback amplifier 10 also comprises a parallel feedback resistor RFB, a series feedback resistor REE2, and a bias resistor REE1. The bias resistor REE1 is used to bias the transistor Q1. The bias section 14 is used to stabilize the bias of the self-biased Darlington feedback amplifier 10 without relying on an external resistor.

The self-biased feedback circuit 14 generally comprises a blocking resistor RDC, a transistor $Q_{BIAS}$, a resistor $R_{ISO}$, a resistor $REE_{BIAS}$ and a bypass capacitor $C_{BYP1}$. The resistor RDC is implemented as an RF blocking resistor. The transistor $Q_{BIAS}$ is implemented as a biasing transistor. The resistor $R_{ISO}$ is implemented as an RF isolation for preventing RF or intermediate frequency IF signals from being fed back to the base of transistor Q1. The emitter biasing resistor $REE_{BIAS}$ may be coupled between the emitter of the transistor $Q_{BIAS}$ and a fixed voltage node such as ground. The capacitor $C_{BYP1}$ is implemented as an alternating current (AC) bypass capacitor. The transistor $Q_{BIAS}$ generally operates as a pseudo mirror bias transistor of the transistor Q2. The bias section 14 generally works in conjunction with the parallel feedback resistor RFB to set up a reference current IBB. The reference current IBB is approximately mirrored to the transistor Q2 as a bias current ICC2. The relationship between IBB and ICC2 is only approximate, but generally mirror each other in current over temperature, supply voltage, and input drive level variations. The ratio of the areas of the transistor $Q_{BIAS}$ and the transistor Q2, and the emitter resistors $REE_{BIAS}$ and REE2, are generally scaled in proportion to the bias currents IBB and ICC2, respectively. For example, if the bias current IBB is 1 mA and the bias current ICC2 is 100 mA, then the area of the transistor $Q_{BIAS}$ may be implemented as 1/100th of the area of the transistor Q2. The resistor $REE_{BIAS}$ will approximately be one hundred times the value of the resistor REE2. However, other ratios may be implemented to meet the design criteria of a particular implementation.

The values of the blocking resistor RDC and the resistor $R_{ISO}$ are generally chosen for optimum RF performance versus DC bias sensitivity. For optimal RF performance, the resistor $R_{ISO}$ should typically be greater than about 10Ω but less than about 1,000Ω. The value of the blocking resistor RDC should typically be greater than about 100Ω but less than about 10,000Ω. DC stability may be relaxed in favor of RF performance or vice versa to obtain combinations outside of these ranges.

The bypass capacitor $C_{BYP1}$ and the blocking resistor RDC set a lower frequency limit of operation. The lower frequency limit of operation may be extended by increasing either or both values of the capacitor $C_{BYP1}$ and the blocking resistor RDC. However, increasing the value of the resistance of the blocking resistor RDC will generally degrade the bias mirroring relationship between the transistor $Q_{BIAS}$ and the transistor Q2. The self-biased Darlington feedback amplifier 10 resembles a type of DC current mirror, except that the self-biased Darlington feedback amplifier 10 provides a well defined RF input terminal IN and a well defined RF output terminal OUT. The DC mirror operation is less than ideal due to the RF blocking resistor RDC.

FIG. 2 shows a prior art E-mode PHEMT implementation of the self-biased Darlington feedback amplifier 10 (FIG. 1). A field effect transistor (FET) based self-biased Darlington feedback amplifier 16 includes transistors $M_1$, $M_2$ and $M_3$. E-mode PHEMT devices are chosen for the transistors $M_1$, $M_2$ and $M_3$ because a positive gate to source threshold voltage VGS of E-mode PHEMT devices enables positive supply operation of self-biased Darlington feedback amplifiers. In contrast, depletion mode (D-mode) PHEMT devices are not usable for the transistors $M_1$, $M_2$, and $M_3$, because D-mode devices do not work properly with the FET based self-biased Darlington feedback amplifier 16. Moreover, enhancement mode (E-mode) PHEMT FETs have low parasitic characteristics that allow greater IP3-BW performance as compared to traditional SiGe and InGaP HBT Darlington RF feedback amplifiers. For example, FIG. 3 illustrates a significantly flat response for IP3 over a wideband of frequencies for E-mode PHEMT based Darlington amplifiers, whereas InGaP HBT Darlington amplifiers experience a relatively sharp roll-off over the same wideband frequencies, given a similar bias voltage and current operation.

Turning back to FIG. 2, the transistors $M_1$, $M_2$, and $M_3$ are FET devices that have an order of magnitude lower input capacitance CGS in comparison to a bipolar or HBT device for a similar bias current level. A smaller set of parasitic capacitances help preserve a desirable 180 degree negative feedback at an upper edge of the wideband frequencies of operation. A non-ideal feedback that is less than or greater than 180 degrees at the upper edge of the wideband frequencies of operation will yield a vector feedback that departs from the desirable 180 degree negative feedback. This less than desirable negative feedback is a result of excessive parasitic device capacitance that produces feedback signal phase shifts that result in less than desirable negative feedback distortion cancellation.

In greater detail, the FET based self-biased Darlington feedback amplifier 16 includes a main amplifier section 18 that is implemented with the transistor $M_1$ and transistor $M_2$. A FET bias section 20 is communicatively coupled between the drain of the transistor $M_1$ and gate of the transistor $M_2$. The FET bias section 20 is implemented as a self-biased feedback circuit. The FET based self-biased Darlington feedback amplifier 16 also comprises the parallel feedback resistor RFB, a series feedback resistor $R_{SS2}$, and a bias resistor $R_{SS1}$. The bias resistor $R_{SS1}$ is used to bias the transistor $M_1$. The FET bias section 20 is used to stabilize the bias of the FET based self-biased Darlington feedback amplifier 16 without relying on an external resistor. A resistor $R_{GM}$ serves the function of RDC (FIG. 1) and a capacitor $C_G$ serves the function of $C_{GYP1}$ (FIG. 1). A capacitor $C_{BYPASS}$ coupled between a power supply rail $V_{DD}$ and ground GND filters power that supplies the FET based self-biased Darlington feedback amplifier 16. An inductor $L_{CHOKE}$ prevents RF signals that are amplified by the FET based self-biased Darlington feedback amplifier 16 from passing to GND through either $V_{DD}$ or the capacitor $C_{BYPASS}$.

FIG. 4 depicts a prior art linearized Darlington cascode amplifier 22 for addressing the non-ideal phase due to parasitic capacitances and parasitic inductances. In particular, the linearized Darlington cascode amplifier 22 generally comprises an amplifier section 24, a reference voltage generation circuit 26, and resistors RFB, RBB, RE1, and RE2. The amplifier section 24 generally comprises a transistor Q1, and a transistor Q2. The resistor RFB is a parallel feedback resistor. The resistor RE2 is a series feedback resistor. The resistors RE1 and RBB are bias resistors.

A transistor Q3 is a common base transistor. The transistor Q3 generally acts to increase the breakdown voltage and bandwidth of the amplifier section 24 and also compensates for an open-loop insertion phase of the amplifier section 24, which is dependent on the impedance characteristic of the reference voltage generation circuit 26 coupled to the base of the transistor Q3.

The reference voltage generation circuit 26 is a frequency dependent voltage reference circuit. The reference voltage generation circuit 26 may include an emitter follower (not shown), and at least one inductive element (not shown). The inductive element helps to provide a desirable frequency dependent impedance to the base of the common-base transistor Q3. Further elements can be added to the inductive element to construct a resistor-inductor-capacitor (RLC) network for optimizing gain-bandwidth, IP3, and/or stability performance. By choosing an appropriate combination of the RLC network, the broadband impedance of the reference voltage generation circuit 26 may be tailored to create an optimal impedance and phase at the collector of the transistor Q3, which generally results in improved broadband IP3 performance.

FIG. 5 is a graph that provides an IP3 comparison between a conventional Darlington amplifier (not shown) and the linearized Darlington cascode amplifier 22 (FIG. 4). In comparison to a conventional Darlington amplifier, the linearized Darlington cascode amplifier 22 provides higher IP3 values from about 2G Hz out to about 16 GHz. In the particular example of FIG. 5, a maximized IP3 improvement value is about 7 dBm at about 12 GHz. Overall, the measured IP3 data shows about an 80% improvement in IP3-BW product.

SUMMARY

In general, a linear FET feedback amplifier that is in accordance with the present disclosure includes a Darlington transistor pair having an input transistor and an output transistor configured to generate an output signal at an output node in response to an input signal received through the input node. The linear FET feedback amplifier also includes a frequency bias feedback network communicatively coupled between the output transistor and the input node for providing biasing to the Darlington transistor pair. The frequency bias feedback network is also usable for adjusting at least one characteristic of an amplified version of the input signal that passes through the input transistor and into the frequency bias feedback network. The at least one characteristic can be amplitude or phase, and both amplitude and phase. In at least one embodiment the frequency bias network includes a bias transistor coupled between a feedback coupling network and a fixed voltage node, and a resistor-inductor-capacitor (RLC) tuning network that is tunable within a range that increases a third order intercept point (IP3) to improve an upper frequency band linearity.

The feedback coupling network coupled between the output node and the input node is also for feeding back to the input node a portion of the amplified version of the input signal that passes through the input transistor. In at least one embodiment, the portion of the amplified version of the input signal that passes through the input transistor is phase and amplitude adjusted. In particular, the frequency bias feedback network passes portions of RF and/or intermediate frequency (IF) signals to the input node via the feedback coupling network. Moreover, in at least one embodiment, the output signal at the output node is fed back to the input node via the feedback coupling network.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
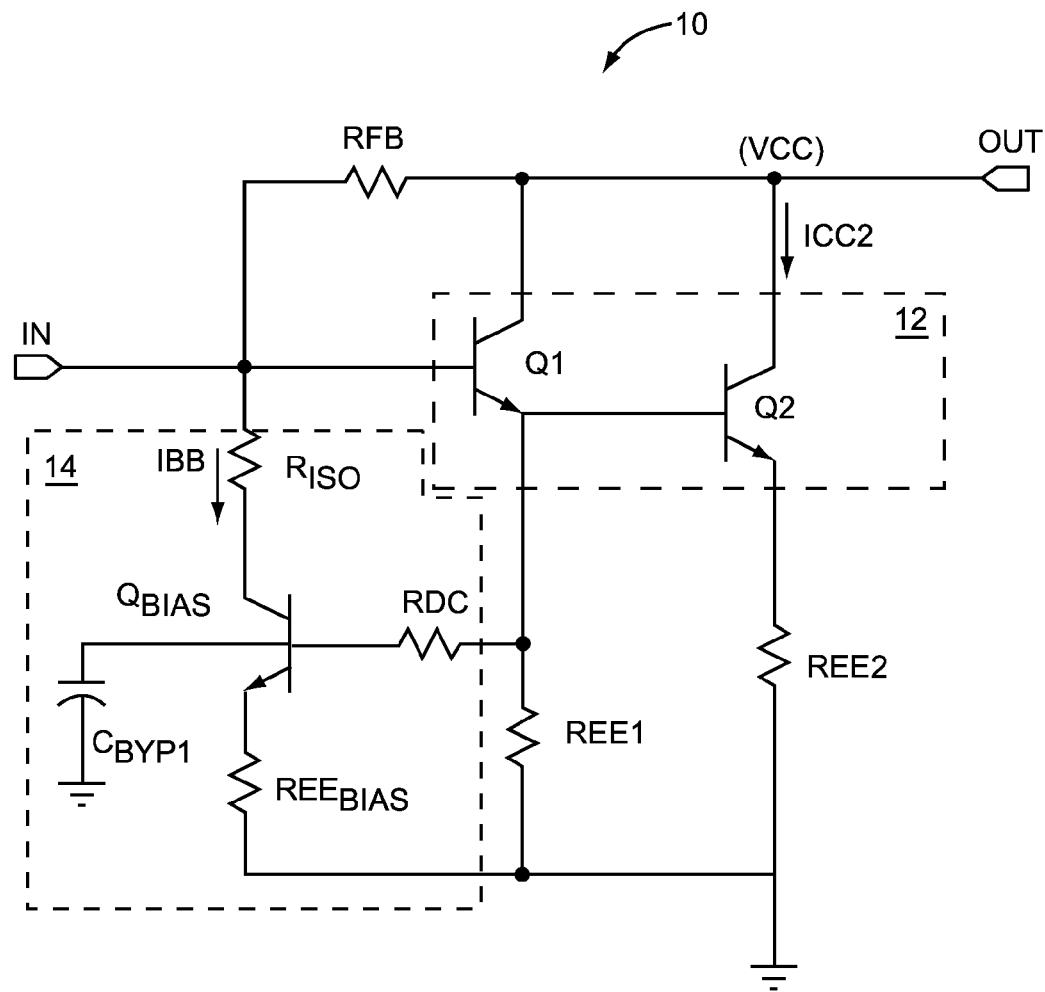
FIG. 1 is a circuit diagram of a simple embodiment of a prior art self-biased Darlington feedback topology.
Figure 2:
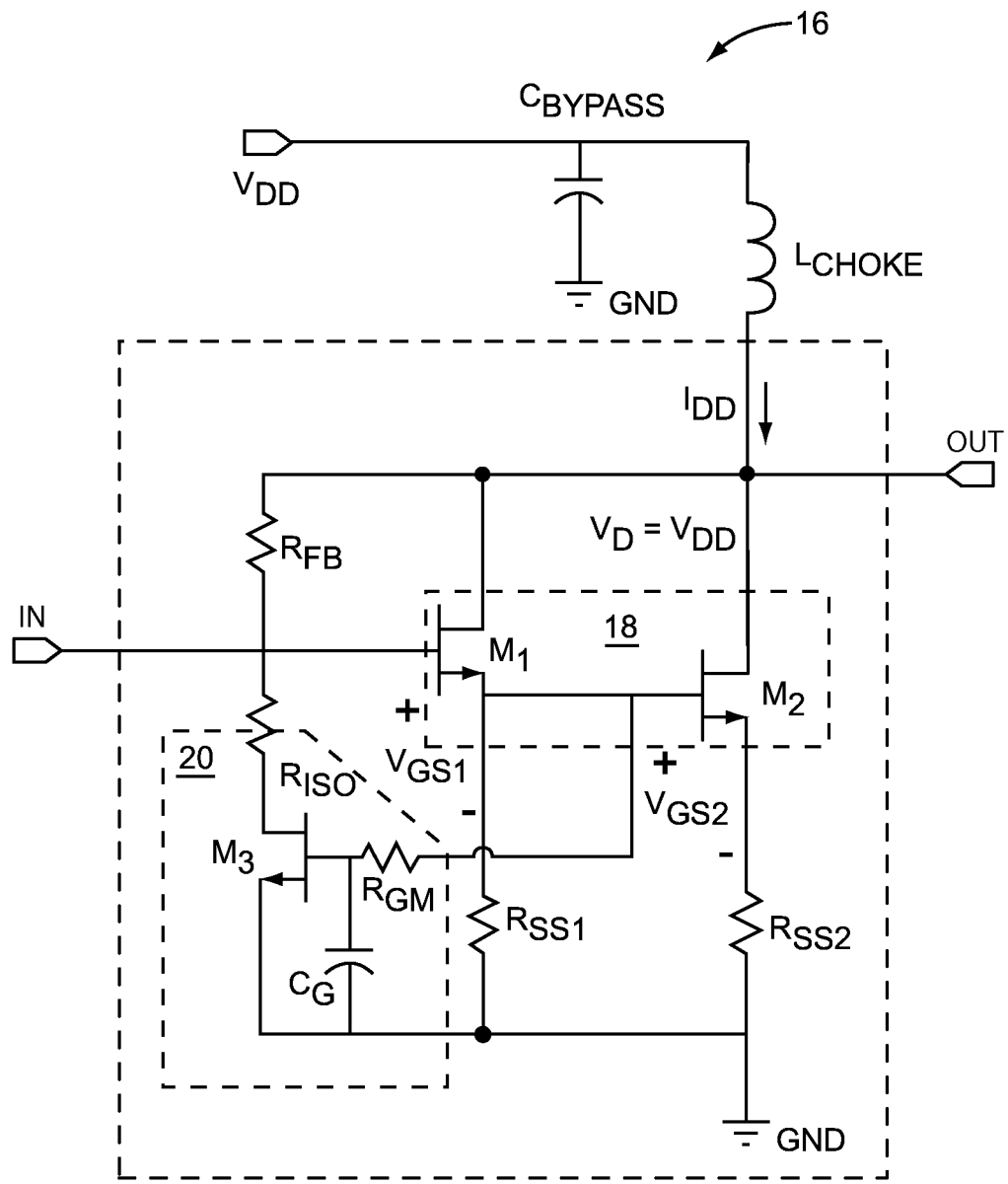
FIG. 2 is a circuit diagram of a prior art enhancement mode (E-mode) pseudomorphic high electron mobility transistor (PHEMT) implementation of the self-biased Darlington feedback topology of FIG. 1.
Figure 3:
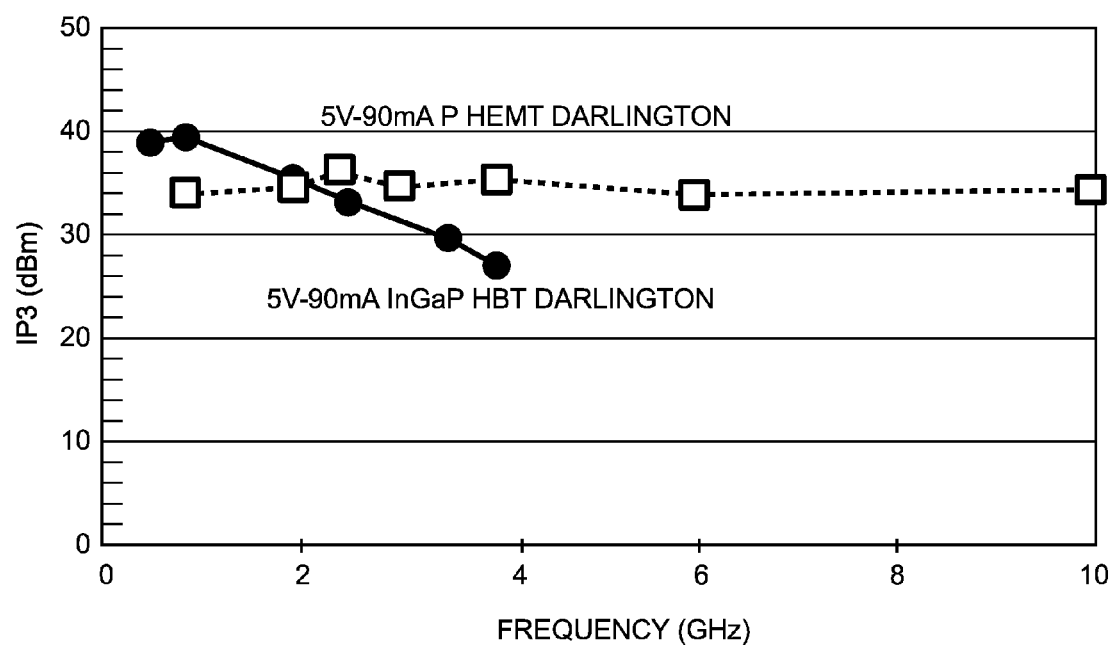
FIG. 3 is a graph that provides a third order intercept (IP3) comparison between an E-mode PHEMT Darlington circuit and an Indium Gallium Phosphide (InGaP) heterojunction bipolar transistor Darlington circuit.
Figure 4:
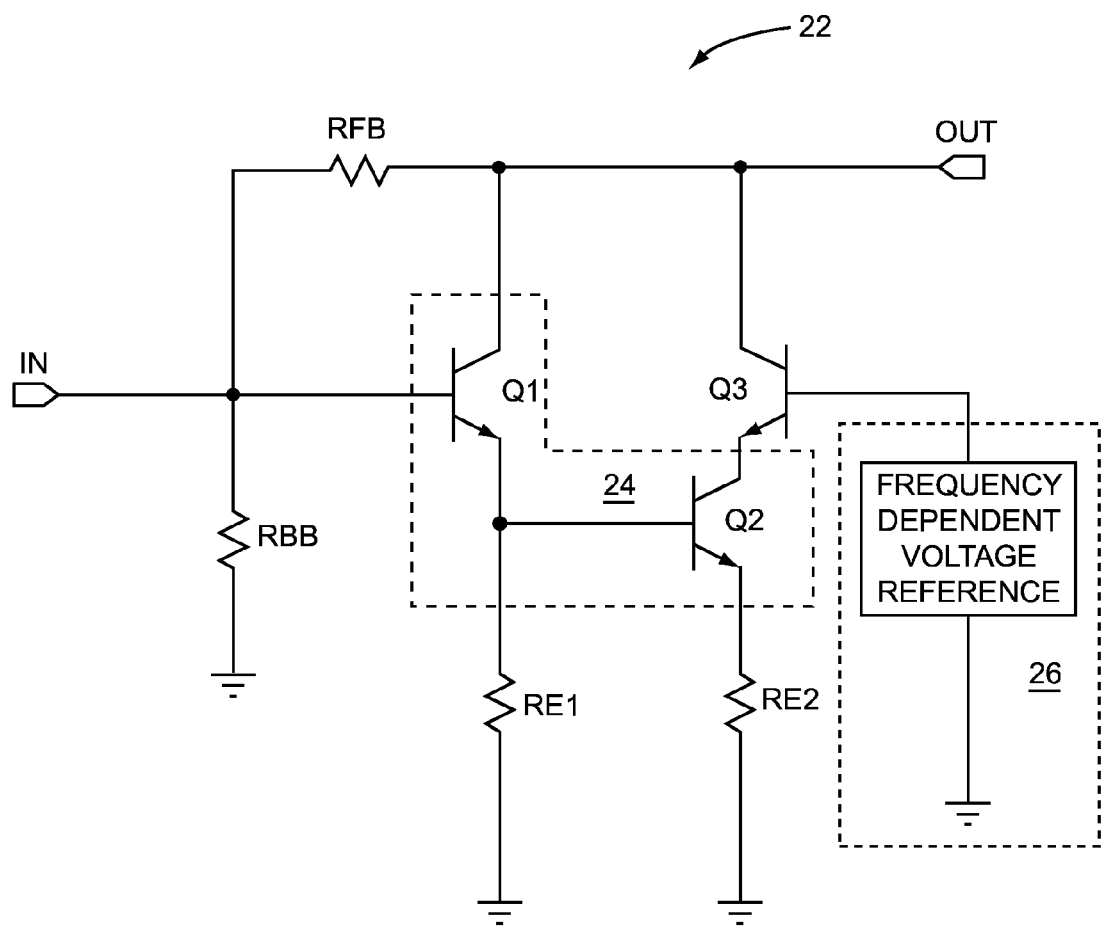
FIG. 4 is a circuit diagram of a prior art linearized Darlington amplifier having a common base cascode transistor including a frequency dependent voltage reference.
Figure 5:
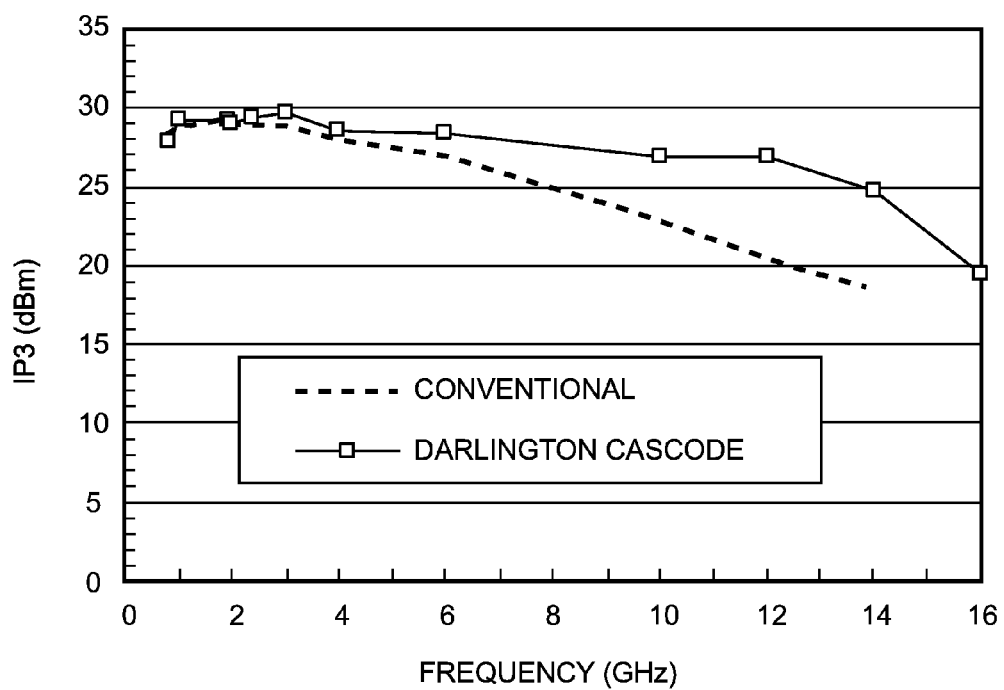
FIG. 5 is a graph that provides a third order intercept point (IP3) comparison between a conventional Darlington amplifier (not shown) and the linearized Darlington amplifier having a common base cascode transistor of FIG. 4.

While the prior art circuits depicted in FIGS. 1, 2 and 4 provide good results for many applications, embodiments of the present disclosure provide even greater improvements for IP3-BW over a wideband frequency range while operating under harsh conditions such as a wide temperature range that may be experienced during operation.

Figure 6:
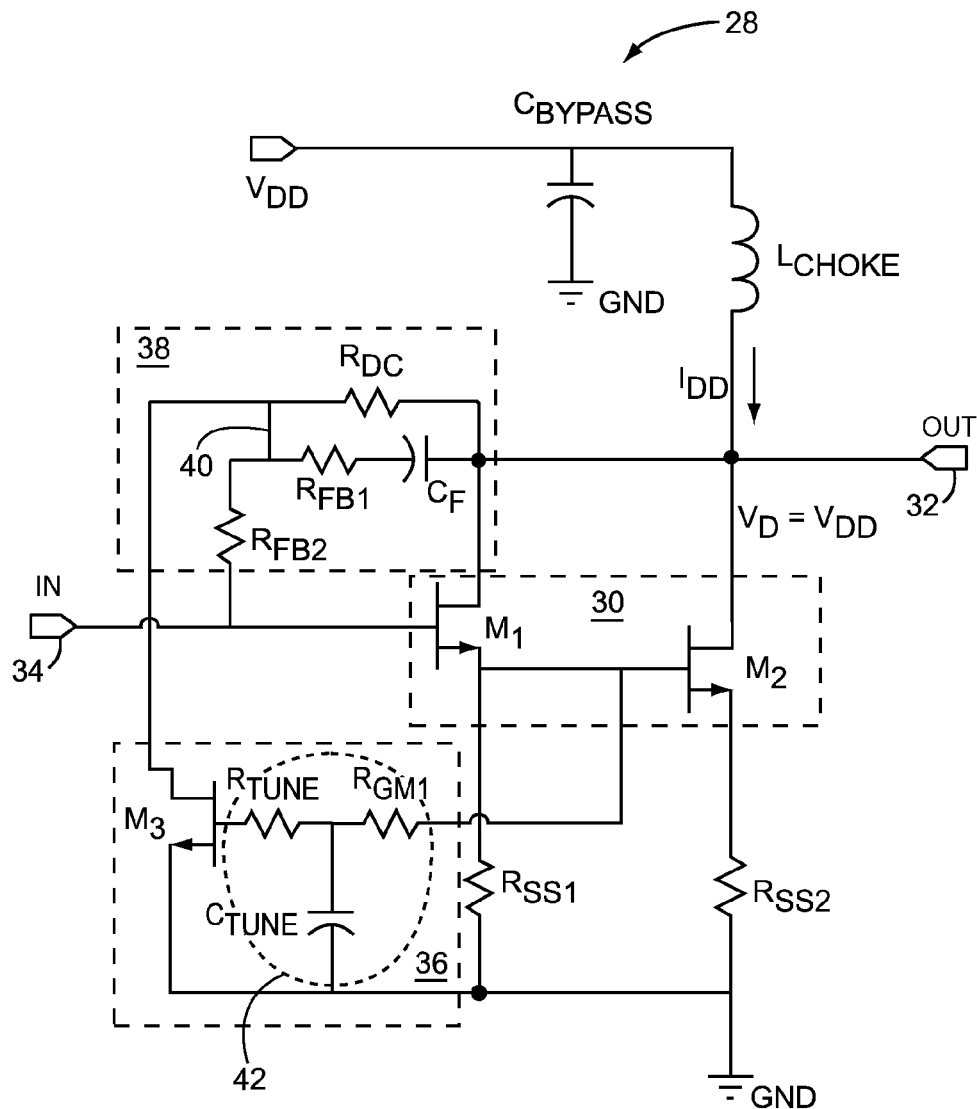
FIG. 6 is a circuit diagram of a simplified embodiment of a linearized field effect transistor (FET) feedback amplifier according to the present disclosure.

FIG. 6 depicts a simplified embodiment of a linear FET feedback amplifier 28 that in accordance with the present disclosure includes a Darlington transistor pair 30 having an input transistor $M_1$ and an output transistor $M_2$ configured to generate an output signal at an output node 32 in response to an input signal received through an input node 34. The linear FET feedback amplifier 28 also includes a frequency bias feedback network 36 that is communicatively coupled between the gate of the output transistor $M_2$ and the input node 34 for providing biasing to the Darlington transistor pair 30. The frequency bias feedback network 36 is also used for adjusting a phase and amplitude of an amplified version of the input signal that passes through the input transistor $M_1$ and into the frequency bias feedback network 36. A feedback coupling network 38 is coupled between the output node 32 and the input node 34 for feeding back to the input node 34 a portion of the amplified version of the input signal that passes through the input transistor $M_1$. In particular, the frequency bias feedback network 36 passes portions of RF and/or intermediate frequency (IF) signals to the input node 34.

In greater detail, a tuning resistor $R_{TUNE}$ combined with the gate to source (Cgs) capacitance of a bias transistor $M_3$ makes up a low pass filter that is in cascade with a resistor-capacitor (R-C) network made up of a tuning capacitor $C_{TUNE}$ and a filter resistor $R_{GM1}$. An adjustment of the resistance value of tuning resistor $R_{TUNE}$ and/or the capacitance value of the tuning capacitor $C_{TUNE}$ can change the phase and amplitude of the RF and IF signals originating from the source of the input transistor $M_1$, and in turn are applied to the gate of the bias transistor $M_3$. The bias transistor $M_3$ inverts and amplifies the RF and IF signals as well as DC signals that are coupled to the input node 34 through a feedback coupling network 38. The phase of the RF and IF signals that are fed back to the input node 34 may be tuned by the tuning capacitor $C_{TUNE}$ and the tuning resistor $R_{TUNE}$ in order to produce cancelled intermodulation (IM) distortion at the output node 32. Moreover, the bias transistor $M_3$ can create additional IM products with advantageous phase and amplitude characteristics that can reduce the IM distortion at the output node 32. The tuning resistor $R_{TUNE}$ and the tuning capacitor $C_{TUNE}$ are tunable to optimize the phase and amplitude of an RF spectrum that includes, but is not limited to desired tones, third order intermodulation (IM3) tones and beat tones that are coupled to the input node 34 and amplified by the bias transistor $M_3$. An upper frequency band linearity of the linear FET feedback amplifier 28 can be increased by as much as 10 dB by tuning the resistor $R_{TUNE}$ to around 150Ω. Comparatively, a lower to mid-band linearity of the linear FET feedback amplifier 28 may be improved by 3 dB to 5 dB by decreasing the value of capacitance for the capacitor $C_{TUNE}$ by about 1 pF.

The feedback coupling network 38 includes a split feedback resistor tap point 40 for a pair of split feedback resistors made up of a first feedback resistor $R_{FB1}$ and a second feedback resistor $R_{FB2}$. A feedback capacitor $C_F$ blocks DC signals and the resistor RDC implement a DC bias set. The split feedback resistor tap point 40 is usable to adjust the amount of RF and IF signal being fed back to the input of the amplifier in order to optimize desired linearity cancellation at RF and IF frequencies. The total value of the first feedback resistor $R_{FB1}$ and the second feedback resistor $R_{FB2}$ generally sets the RF gain-bandwidth of the linear FET feedback amplifier 28. By adjusting the first feedback resistor $R_{FB1}$ to be proportionally larger than the second feedback resistor $R_{FB2}$, more of RF-IF-DC feedback signals output from the bias transistor $M_3$ will be fed back to the input node 34. If the first feedback resistor $R_{FB1}$ is proportionally smaller than the second feedback resistor $R_{FB2}$ a smaller amount of the RF-IF-DC feedback signals will be fed back will be fed back to the input node 34 from the bias transistor M3. As a result, more of the RF-IF-DC feedback signals will be directed toward the output node 32. Thus, the split feedback resistor tap point 40 provides another way to control the amplitude of the RF-IF-DC feedback signals.

In one embodiment, the tuning resistor $R_{TUNE}$, the tuning capacitor $C_{TUNE}$, and the filter resistor $R_{GM1}$ make up a resistor-capacitor-resistor (R-C-R) low pass network 42. The tuning resistor $R_{TUNE}$, the tuning capacitor $C_{TUNE}$, and the filter resistor $R_{GM1}$ are each sized such that a pass pole allows a majority of the IF signal or beat tone (f1-f2) signal to pass through to the gate of the bias transistor $M_3$. A pass frequency may be in the range of 5-10 MHz in order to allow the passage of IM resulting from wideband communication modulation with minimum attenuation. The RF and IF signals passing through the R-C-R low pass network 42 are inverted by the bias transistor $M_3$ and coupled to the input node 34 through the feedback coupling network 38. In this way a negative feedback from a DC to an IF frequency for cancelling unwanted beat frequencies is generated. The RF and IF signals passing through the R-C-R low pass network 42 will experience amplitude changes and a phase shift that can be optimized to generate fundamental and IM products (f1, f2, 2f1-f2, 2f2-f1) through the bias transistor $M_3$ where the net result will be the cancellation of distortion at the output node 32. The tuning resistor $R_{TUNE}$ is a primary component for tuning RF and IF signal phases introduced to the gate of the bias transistor $M_3$. The tuning resistor $R_{TUNE}$ allows phase and amplitude tuning control since the value of resistance for the tuning resistor $R_{TUNE}$ creates a second low pass filter pole with the input capacitance (Cgs) of the bias transistor $M_3$.

As mentioned above, the R-C-R low pass network 42 is a preferred and low cost implementation of a more general function of phase and amplitude control. It should be appreciated that other passive components such as inductors (not shown) can be employed in place of one or more of the filter resistor $R_{GM1}$, the tuning capacitor $C_{TUNE}$, and the resistor $R_{TUNE}$ to achieve phase and amplitude control of the frequency bias feedback network 36. Moreover, the R-C-R low pass network 42 is simplified to a simple resistor capacitor (RC) network by combining the resistances of the filter resistor $R_{GM1}$ and the resistor $R_{TUNE}$.

The resistor $R_{TUNE}$ and the tuning capacitor $C_{TUNE}$ are sized to provide a low pass filter (LPF) transfer function that allows the adjustment of the phase and amplitude of RF signals and IF signals being fed back to the input node 34. By reducing $C_{TUNE}$ and/or increasing $R_{TUNE}$, the phase and amplitude can be adjusted at the RF frequency for optimizing the RF signal and IM3 signal phase and amplitude that are fed back to the input of the amplifier through the bias transistor $M_3$, and the coupling network. In one preferred embodiment of the linear FET feedback amplifier 28 (FIGS. 6 and 7), the resistor $R_{TUNE}$ may be 100Ω.

In the prior art self-biased Darlington feedback amplifier 10 (FIG. 1), $C_{BYP1}$ (FIG. 1) is a relatively large capacitor that bypasses, and effectively isolates RF signals from modulating the bias transistor $M_3$ in order to prevent the generation of unwanted non-linearity. In contrast, the value of $C_{TUNE}$ and a non-zero value $R_{TUNE}$ of the linear FET feedback amplifier 28 effectively provides a phase and amplitude shift of the RF and IF signals presented to the base of the bias transistor $M_3$ which generates RF products that have phase and amplitude characteristics which help reduce the IM distortion at the output of the amplifier.

Figure 7:
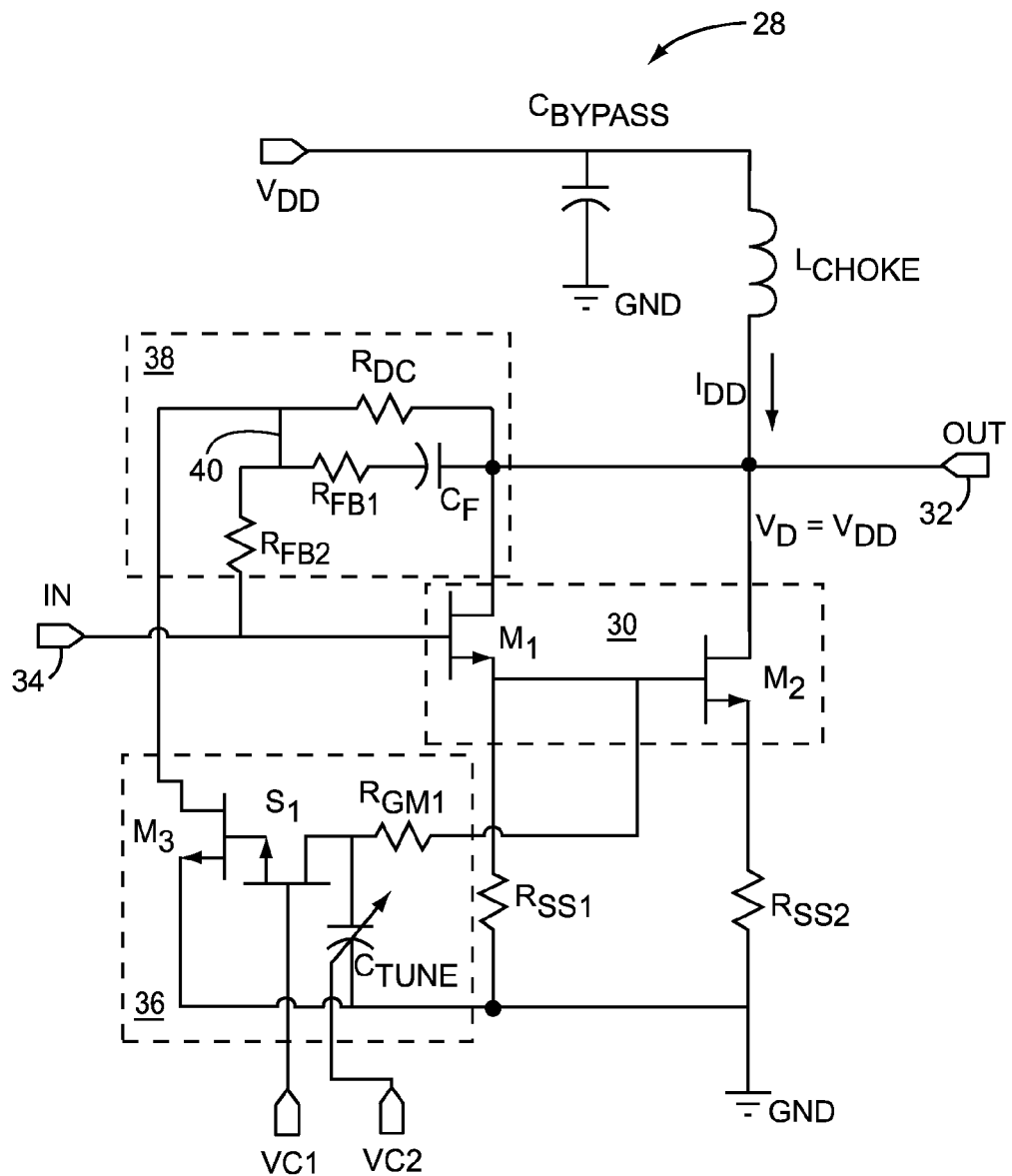
FIG. 7 is a circuit diagram of a simplified embodiment of the linear FET feedback amplifier including electronic tuning in accordance with the present disclosure.

The R-C-R low pass network 42 comprised of the filter resistor $R_{GM1}$, the tuning capacitor $C_{TUNE}$, and the resistor $R_{TUNE}$ may be replaced by electronic devices that provide a phase shifter and amplitude attenuator. FIG. 7 depicts an adaptation of the linear FET feedback amplifier 28 that provides electronic tuning control for the frequency bias feedback network 36 in accordance with the present disclosure. In this particular embodiment, the resistor $R_{TUNE}$ is replaced with a FET variable resistor (varistor) S1 that has a variable resistance that is electronically controllable via a first control signal VC1. Moreover, in this embodiment the capacitor $C_{TUNE}$ has a variable capacitance that is electronically controllable via a second control signal VC2. In this way, the R-C-R low pass network 42 becomes an electronically controllable phase shifter and amplitude attenuator. The variable capacitance version of $C_{TUNE}$ may be, but is not limited to a variable capacitor in the form of a varactor diode and a switchable capacitor array. By adjusting the first control signal VC1 and/or the second control signal VC2, linearity versus frequency profile may be tuned for a desired frequency response. As such, the R-C-R low pass network 42 can be realized as an electronically controllable phase shifter and amplitude attenuator.

It is important to note that other embodiments of linear FET feedback amplifiers in accordance with the present disclosure may only include the FET varistor S1 or may only include the electronically controllable version of the capacitor $C_{TUNE}$. In a case in which only the FET varistor S1 is used, the capacitor $C_{TUNE}$ will have a fixed capacitance value. Alternately, if the electronically controllable version of the capacitor $C_{TUNE}$ is used, the FET varistor S1 is replaced with the resistor $R_{TUNE}$ (FIG. 6), which has fixed resistance value.

Figure 8:
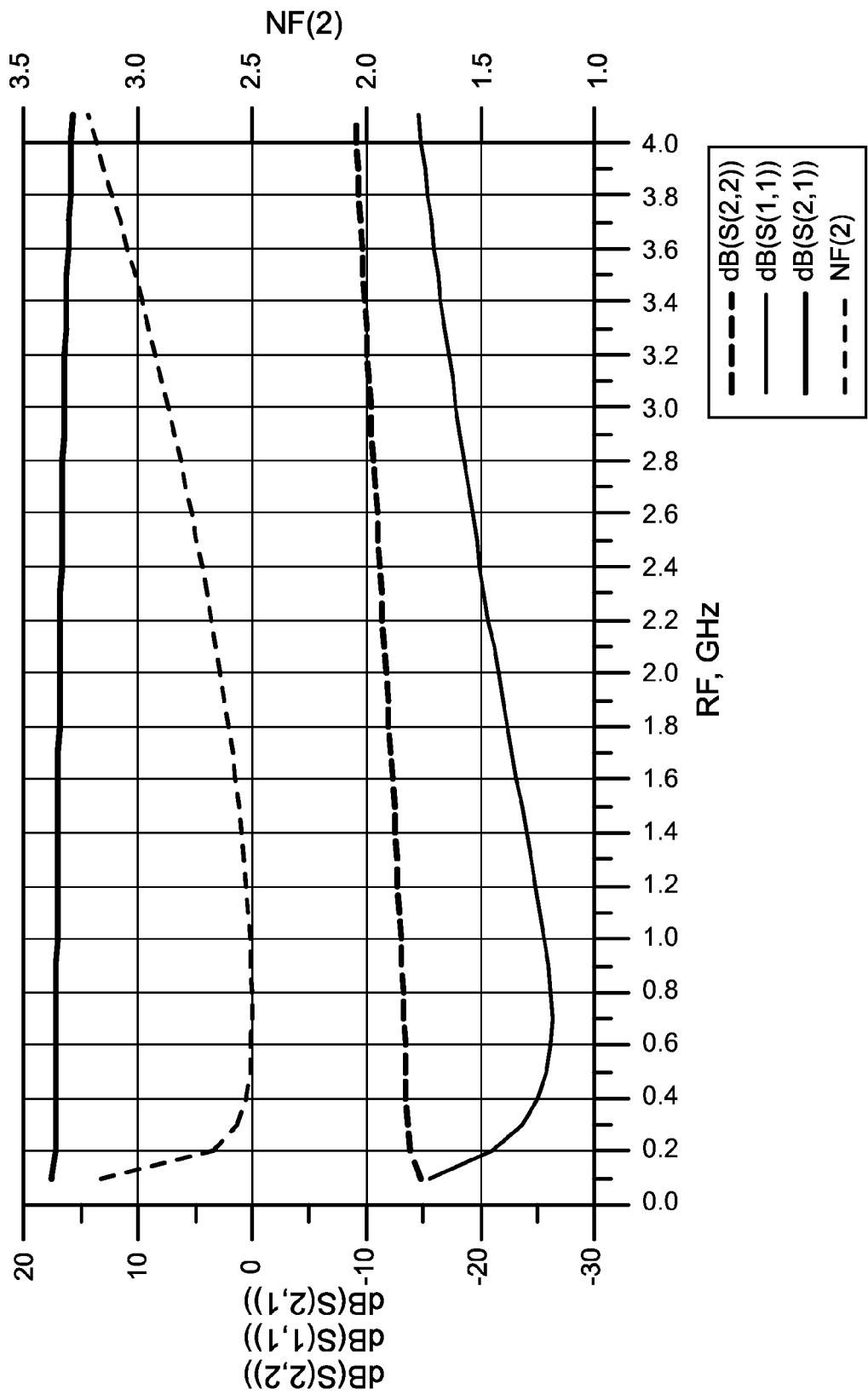
FIG. 8 is a graph depicting nominal broadband performance of the E-mode PHEMT of FIG. 6.

FIG. 8 is a graph depicting nominal broadband performance of the linear FET feedback amplifier 28 of FIG. 6. The left side vertical axis of the graph represents dB units for the magnitude data for the scattering parameters S(1,1), S(2,1) and S(2,2). The right side vertical axis of the graph represents dB units for noise figure (NF) data for the linear FET feedback amplifier 28.

The scattering parameter S(2,1) representing forward gain shows about a 15.5 dB gain with a 3 dB bandwidth (BW) that is greater than 4 GHz, which is sufficient for many of the popular wireless frequency bands such as the long term evolution (LTE) Advanced frequency bands. As shown in the graph of FIG. 8, the NF data for the linear FET feedback amplifier 28 is relatively good, being less than 3 dB from about 0.2 GHz to about 3.6 GHz. Moreover, the input return-loss (i.e., S(1,1)) is excellent, being less than −15 dB across the entire frequency range of 0.1 GHz to 4.0 GHz. Further still, the output return-loss (i.e., S(2,2)) is relatively good, being below −10 dB from about 0.1 GHz to about 3.2 GHz.

Figure 9:
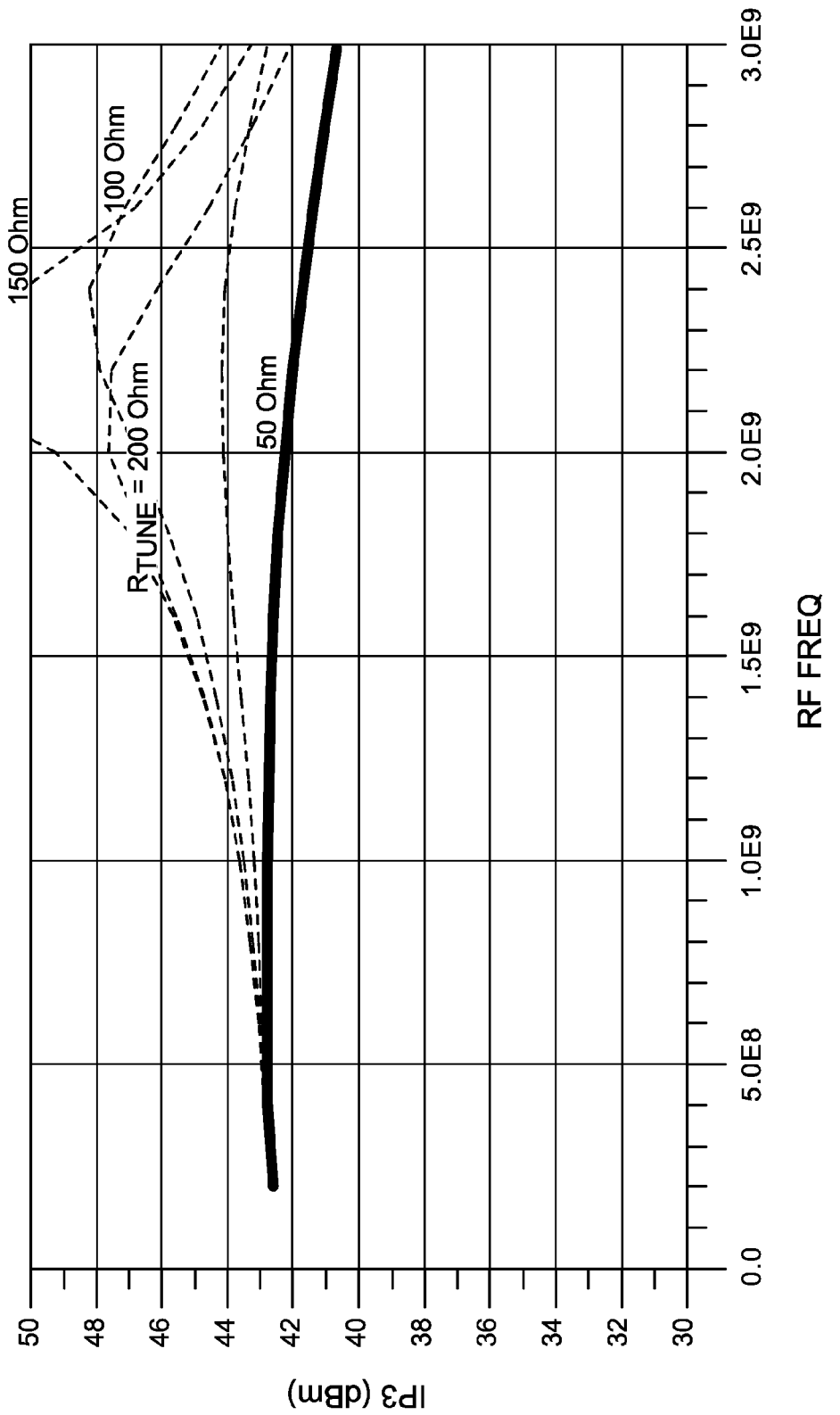
FIG. 9 is a graph showing IP3 simulations for a frequency bias feedback network of FIG. 6 having a fixed tuning capacitor value and swept resistance values for a tuning resistor.

FIG. 9 is a graph showing IP3 simulations for the frequency bias feedback network 36 (FIGS. 6 and 7) having a fixed tuning capacitor value and swept resistance values for a tuning resistor. In particular, the graph of FIG. 9 shows simulated IP3 versus frequency response for the linear FET feedback amplifier 28 (FIG. 6). A fixed value of 10 pF for $C_{TUNE}$ was used for the simulation. Two tone IP3 measurements were performed with a difference frequency of 1.3 MHz with output tones of 0 dBm. The FIG. 9 graph shows the IP3 vs. frequency performance for various values of $R_{TUNE}$ and compares the various improvements to a baseline case where $R_{TUNE}$ is set to zero Ohms. At a frequency of 2.3 GHz, the optimum $R_{TUNE}$ value is 150Ω, which achieves over 8 dB of IP3 improvement. At an $R_{TUNE}$ of 100Ω, the IP3 improvement is a relatively high 6 dB.

Figure 10:
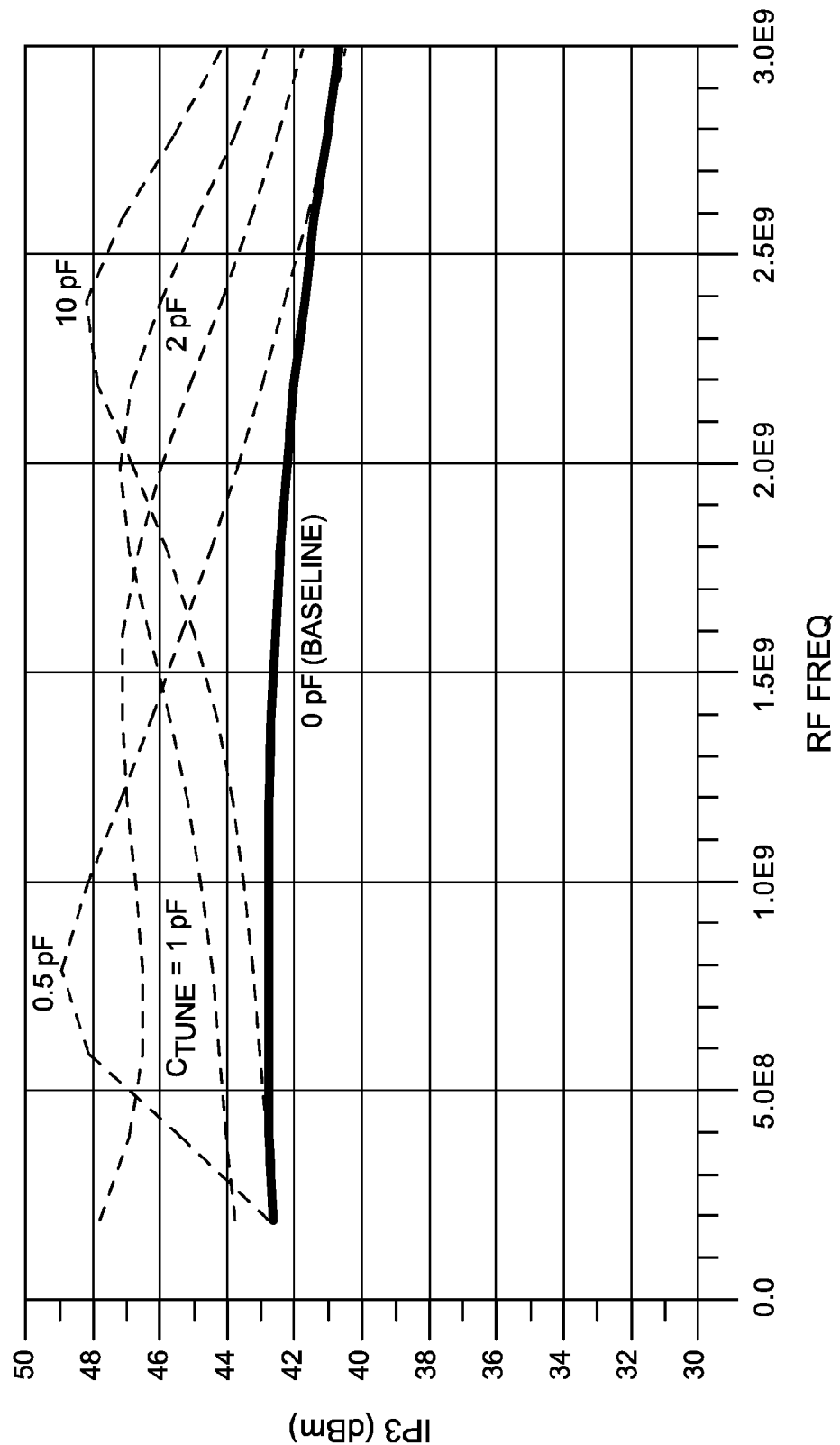
FIG. 10 is a graph showing IP3 simulations for the frequency bias feedback network of FIG. 6 having a fixed tuning resistor value and swept capacitance values for the tuning capacitor.

FIG. 10 is a graph showing IP3 simulations for the frequency bias feedback network 36 (FIGS. 6 and 7) having a fixed tuning resistor value and swept capacitance values for the tuning capacitor. The graph of FIG. 10 provides simulated IP3 vs. frequency response for the linear FET feedback amplifier 28 for a fixed $R_{TUNE}$ of 100Ω and swept capacitance values for the capacitor $C_{TUNE}$. Two tone IP3 measurements were performed with a difference frequency of 1.3 MHz with output tones of 0 dBm. The graph shows the IP3 versus frequency performance for various values of capacitance for $C_{TUNE}$ and compares the various improvements to a baseline case where the capacitance of $C_{TUNE}$ is equal to 0 pF. A desired effect of reducing the size of $C_{TUNE}$ is to improve the lower frequency IP3 response. At an intermediate value of 1 pF, the response shows a broad IP3 frequency response with an average IP3 improvement of 3 dB to 4 dB from 200M Hz up to 1.5 GHz. A nominal IP3 of 47 dBm is achieved from a 5V source while drawing 105 mA of source current.

Figure 11:
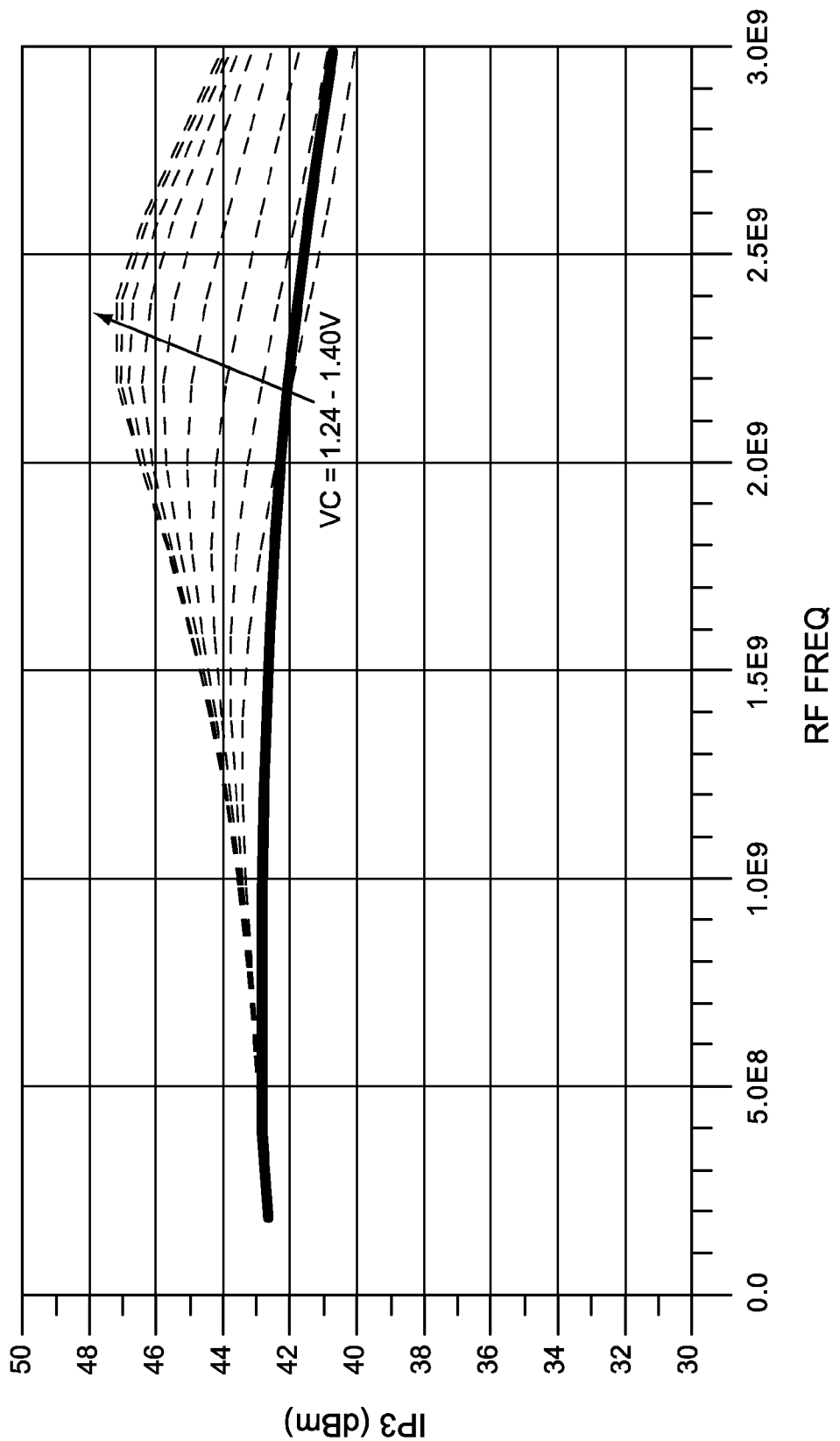
FIG. 11 is a graph showing IP3 simulations for the frequency bias network of FIG. 7 having a fixed tuning capacitor value with varistor tuning.

FIG. 11 is a graph showing IP3 simulations for the frequency bias network of FIG. 7 having a fixed tuning capacitor value with varistor tuning. The graph of FIG. 11 provides simulated IP3 versus frequency response of the linear FET feedback amplifier 28 having a fixed capacitance equal to 10 pF for the tuning capacitor $C_{TUNE}$. Two tone IP3 measurements were performed with a difference frequency of 1.3 MHz with output tones of 0 dBm. The graph shows the IP3 versus frequency performance for various values of tuning voltage, which is swept from 1.24V to 1.40V. Results depicted on the graph show an improvement of as much as 5 dB at a frequency of 2.3 GHz. The simulations depicted on the graph include nonlinearities attributable to the FET varistor S1.

Figure 12:
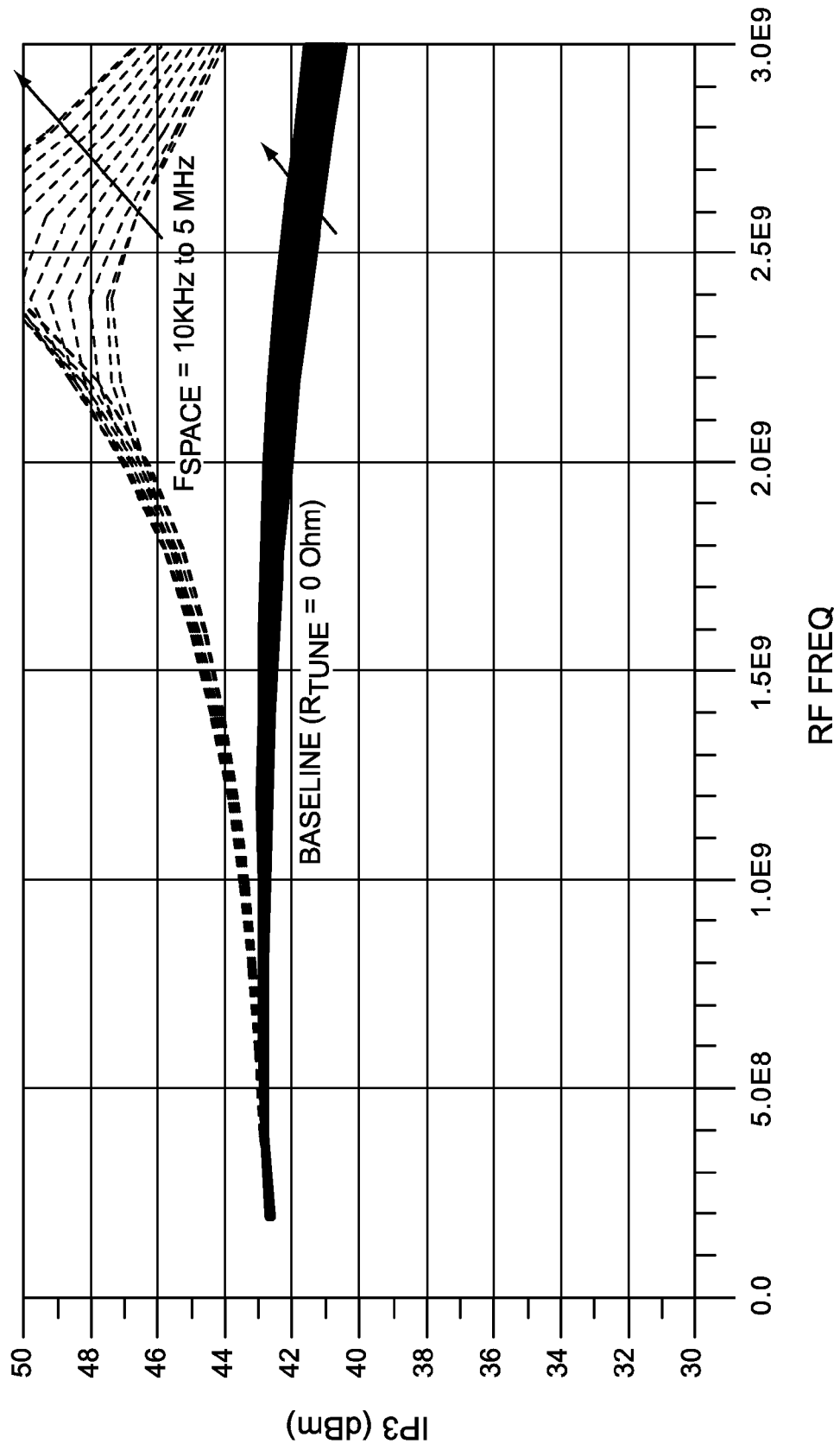
FIG. 12 is a graph depicting IP3 sensitivity to tone spacing over frequency for the linear FET feedback amplifier of FIG. 6.

FIG. 12 is a graph depicting IP3 sensitivity to tone spacing over frequency for the linear FET feedback amplifier 28 (FIG. 6). The graph of FIG. 12 shows the IP3 sensitivity to tone spacing over frequency in comparison to a baseline performance and illustrates that the linear FET feedback amplifier 28 can maintain an advantage of about 4 dB of IP3 improvement at 2.3 GHz over swept tone spacings from 10 kHz to 5 MHz. Moreover, the linear FET feedback amplifier 28 achieves at least a 3 dB improvement over the enhanced frequency range from 2 GHz to 2.7 GHz.

Figure 13:
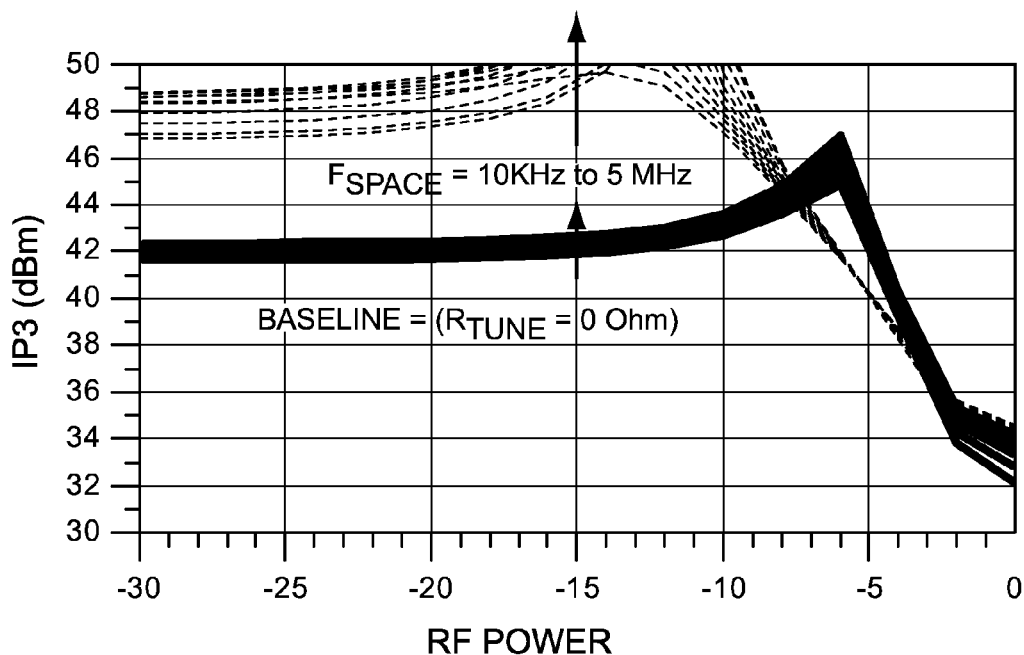
FIG. 13 is a graph depicting IP3 sensitivity to tone spacing and power level for the linear FET feedback amplifier of FIG. 6.

FIG. 13 is a graph depicting IP3 sensitivity to tone spacing and power level for the linear FET feedback amplifier 28 of FIG. 6. FIG. 13 illustrates the IP3 improvements over swept tone spacing and input power levels. An IP3 benchmark is typically specified at Pout=0 dBm. Since there is 15.5 dB of gain, this would correspond to an input power of about −15 dBm. An IP3 improvement of greater than 6 dB is maintained over tone spacing at an RF input power of −15 dBm.

Figure 14:
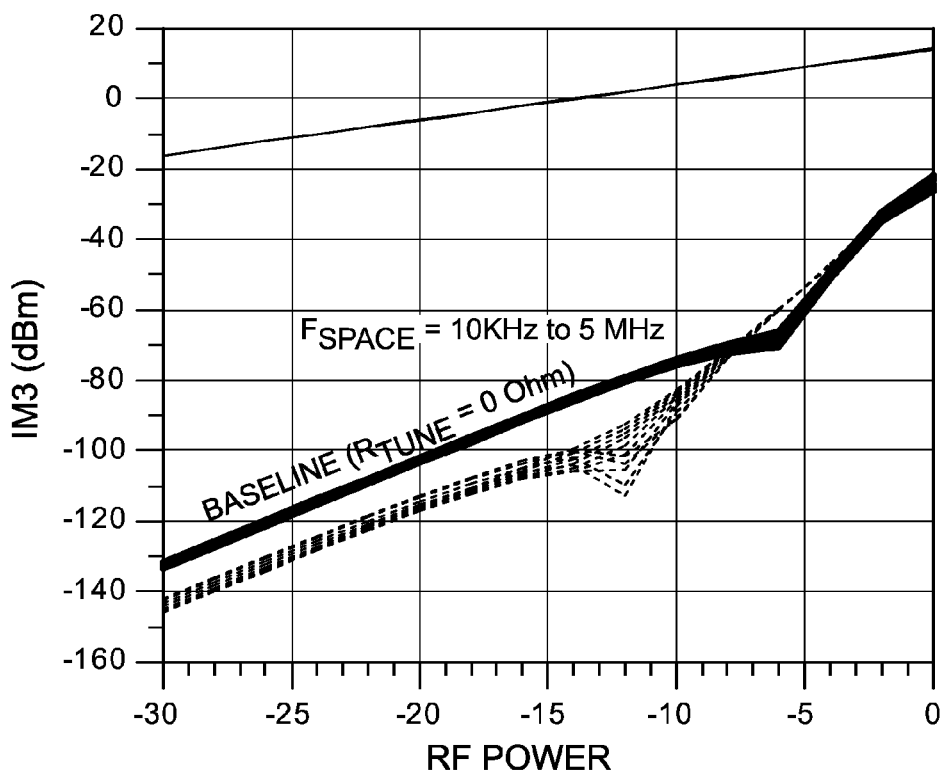
FIG. 14 is a graph depicting detailed third order intermodulation (IM3) sensitivity to tone spacing and power level for the linear FET feedback amplifier of FIG. 6.

FIG. 14 is a graph depicting detailed IM3 sensitivity to tone spacing and power level for the linear FET feedback amplifier 28 of FIG. 6. The detailed Pout and IM3 graphs show that the linear FET feedback amplifier 28 significantly improves the IM3 suppressing up to an RF input power of −10 dBm (Pout=5.5 dBm, exceeding the typical gain block spec of Pout=0 dBm) while maintaining the IM3 3:1 slope over power. This validates that the linearization is fundamentally sound and works over at least the 20 dB of dynamic range indicated in FIG. 14.

Figure 15:
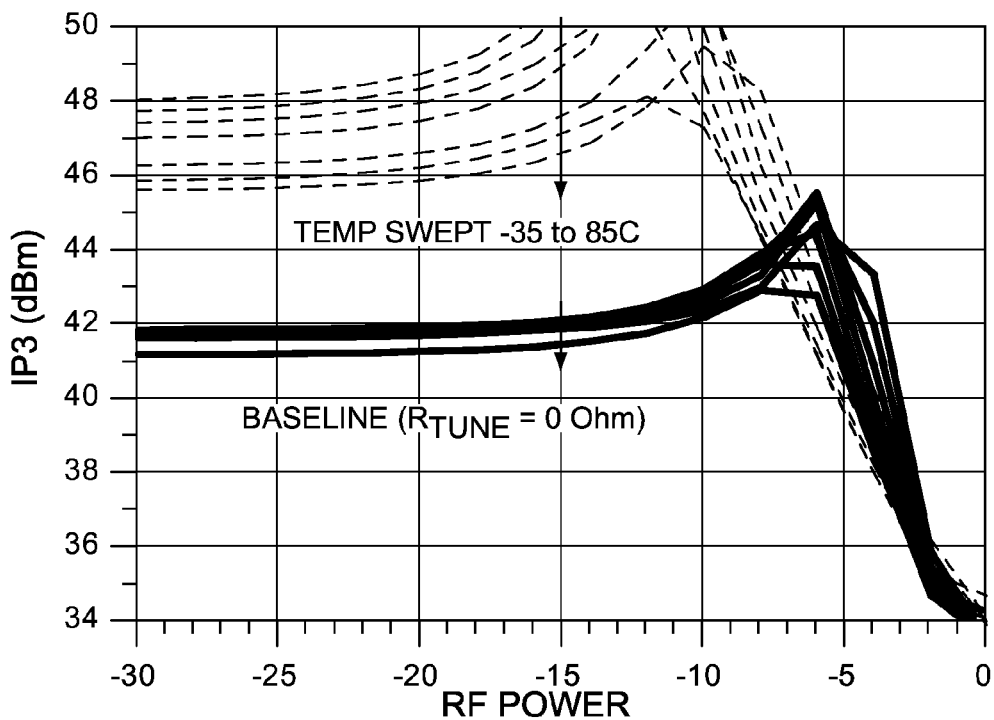
FIG. 15 is a graph depicting IP3 sensitivity to temperature and power level for the linear FET feedback amplifier of FIG. 6.

FIG. 15 is a graph depicting IP3 sensitivity to temperature and power level for the linear FET feedback amplifier 28 of FIG. 6. An IP3 benchmark is typically specified for an output power (Pout) that is 0 dBm. Since there is 15.5 dB of gain, this would correspond to an input power of about −15 dBm. As illustrated graphically in FIG. 15, an IP3 improvement that is greater than 3 dB is maintained over temperature at an RF input power of −15 dBm.

Figure 16:
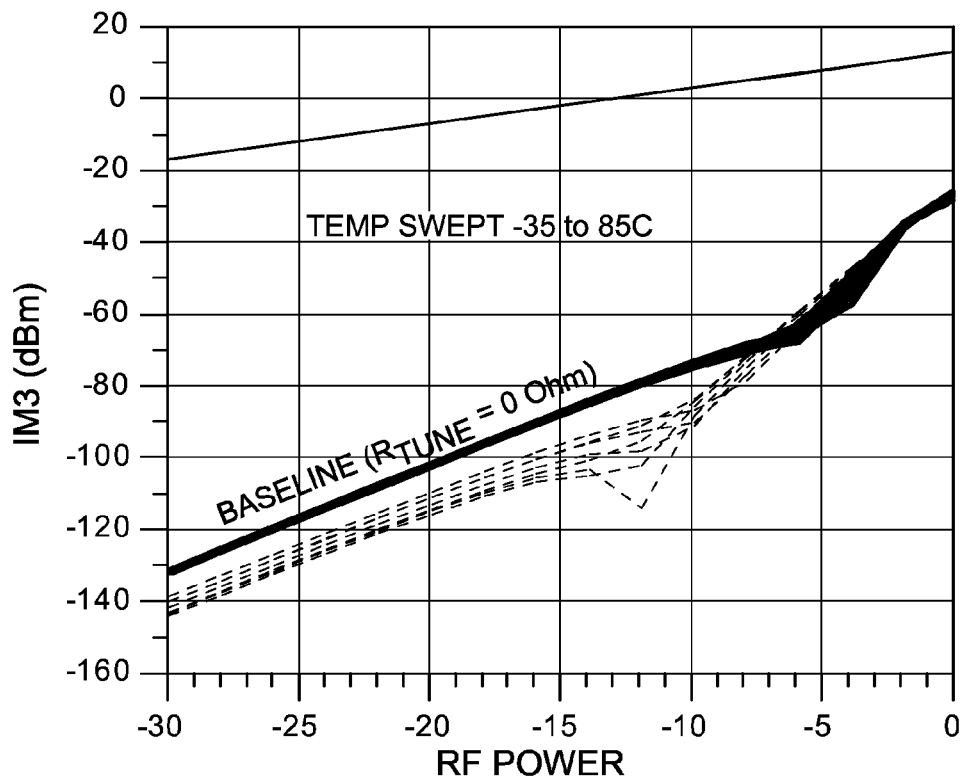
FIG. 16 is a graph depicting IM3 sensitivity to temperature and power level for the linear FET feedback amplifier of FIG. 6.

FIG. 16 is a graph depicting IM3 sensitivity to temperature and power level for the linear FET feedback amplifier 28 of FIG. 6. The graph depicting IM3 shows that the linear FET feedback amplifier 28 significantly improves the IM3 suppressing up to an RF input power of −10 dBm with a Pout of at least 5.5 dBm, thereby exceeding the typical gain block specification of a Pout of only 0 dBm while maintaining an IM3 3:1 slope over a desired power range. These results validate that the linearization provide by the linear FET feedback amplifier 28 is fundamentally sound and works over at least the 20 dB of dynamic range as indicated by the graph of FIG. 16.

Figure 17:
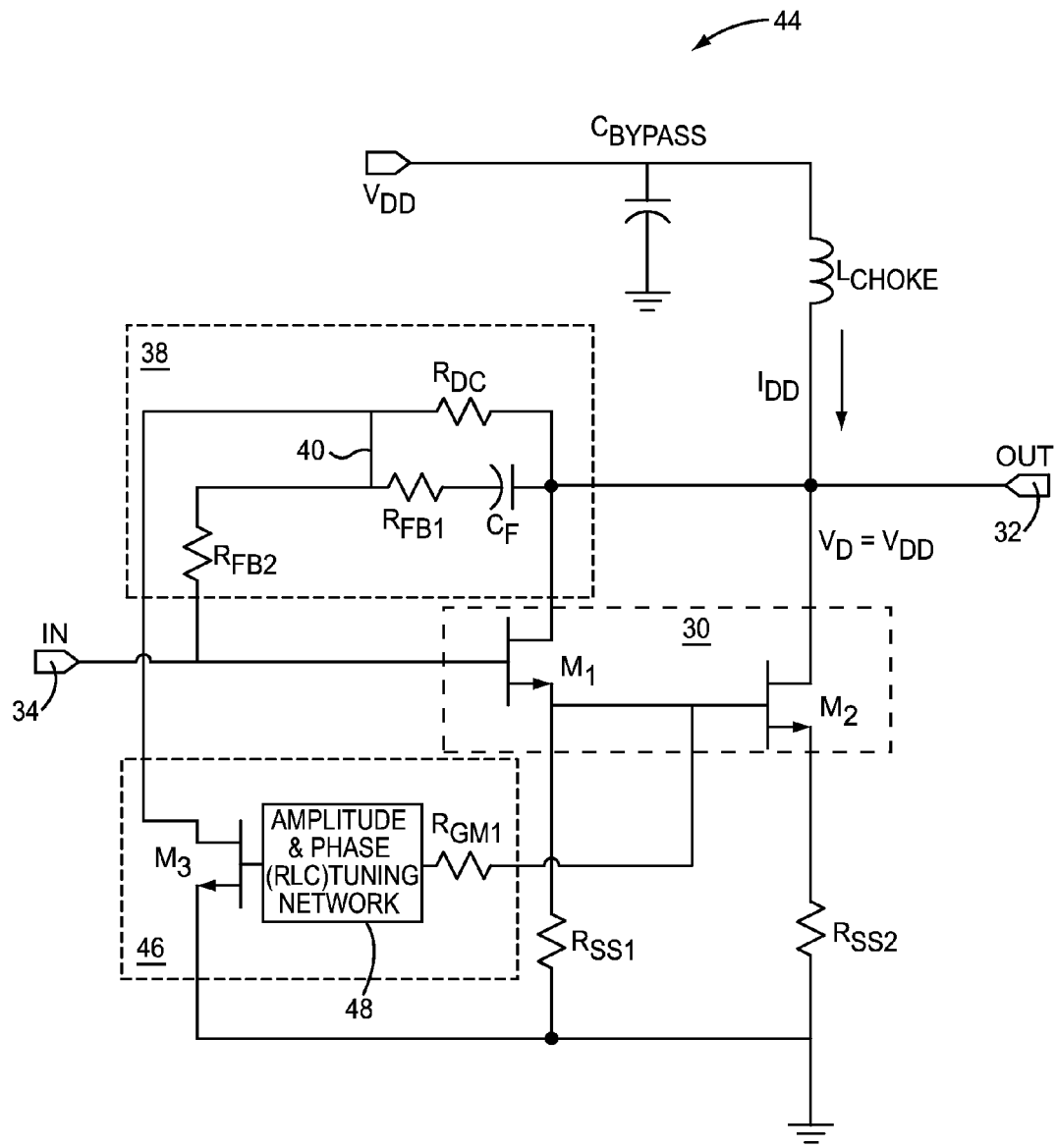
FIG. 17 is a circuit diagram of a general embodiment of a linear FET feedback amplifier having a resistor-inductor-capacitor (RLC) type tuning network.

FIG. 17 is a circuit diagram of a general embodiment of a linear FET feedback amplifier 44 with a frequency bias feedback network 46 having a resistor-inductor-capacitor (RLC) type tuning network 48. The general embodiment of the linear FET feedback amplifier 44 is similar to the simple embodiment of the linear FET feedback amplifier 28 (FIG. 6) with the exception of the frequency bias feedback network 46. In this case, the frequency bias network includes an inductor to enhance IP3 performance.

Figure 18:
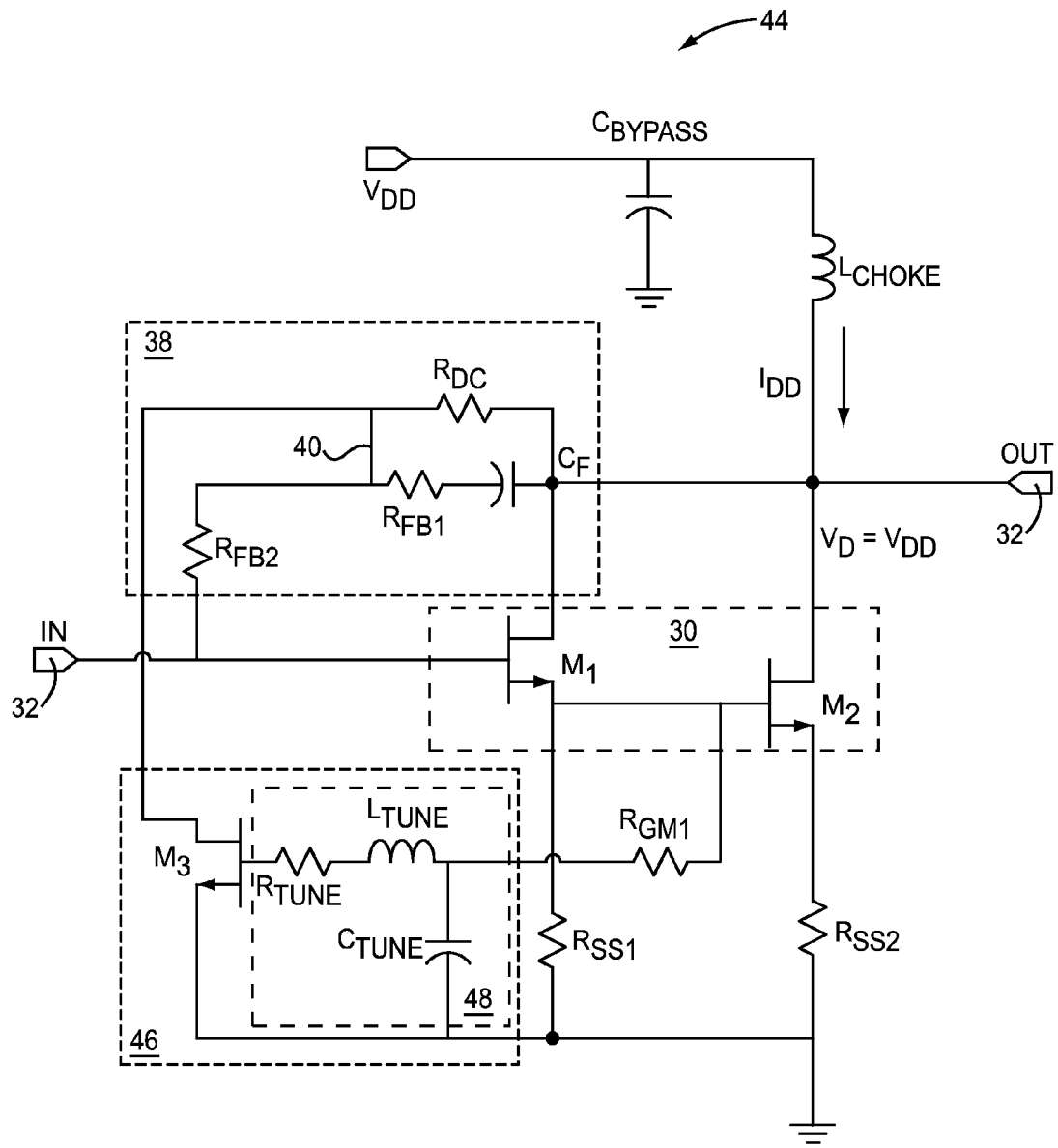
FIG. 18 is a circuit diagram of a first embodiment of the linear FET feedback amplifier employing an RLC type tuning network with a tuning inductor.

FIG. 18 is a circuit diagram of a first embodiment of the linear FET feedback amplifier 44 employing the RLC type tuning network 48. In this first embodiment the inductor is a tuning inductor $L_{TUNE}$. The RLC type tuning network also include the tuning resistor $R_{TUNE}$ and the tuning capacitor $C_{Tune}$ that is also present in the R-C-R low network 42 of the linear FET feedback amplifier 28 (FIG. 6). In this first embodiment of the linear FET feedback amplifier 44, the tuning inductor $L_{TUNE}$ is coupled between the tuning resistor $R_{TUNE}$ and the filter resistor $R_{GM1}$. The tuning capacitor $C_{TUNE}$ is coupled between a fixed voltage node such as ground and another node that connects the tuning inductor $L_{TUNE}$ to the filter resistor $R_{GM1}$.

Figure 19:
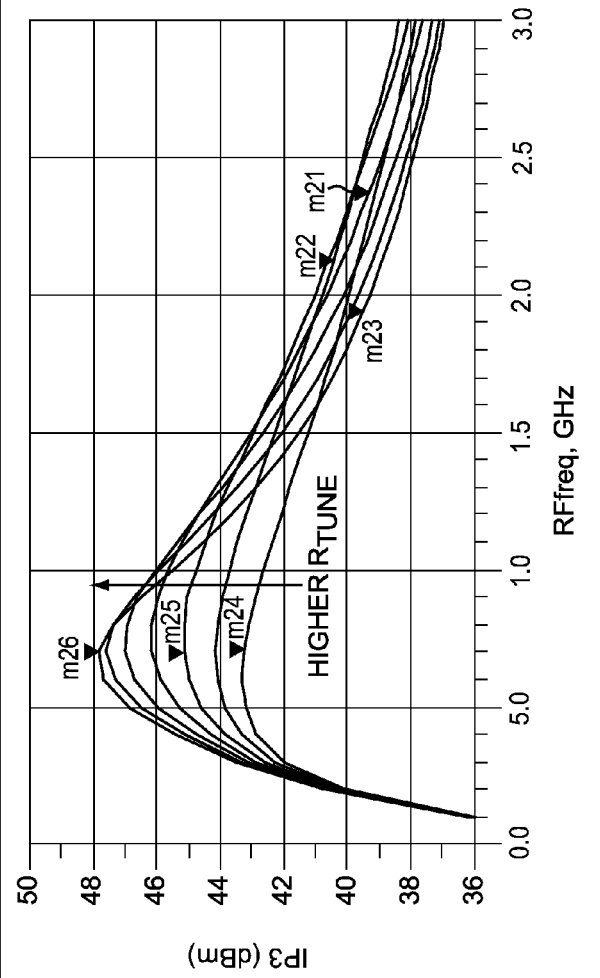
FIG. 19 is a graph showing IP3 simulations for the RLC type tuning network of FIG. 18 having swept resistance values for the tuning resistor.

FIG. 19 is a graph showing IP3 simulations for the RLC type tuning network 48 (FIG. 18) having swept resistance values for the tuning resistor $R_{TUNE}$. In particular, the graph of FIG. 19 shows an improvement in IP3 performance as a result of adjusting tuning resistor $R_{TUNE}$. Markers are illustrated at both 700 MHz and 2 GHz. Up to a point improvements in IP3 are achieved as the resistance value of $R_{TUNE}$ is increased. However, as can be seen from the graph, it is not necessarily the case that higher values of resistance for $R_{TUNE}$ yield higher IP3 performance. For instance in this exemplary case, a maximum IP3 performance occurs at a frequency of 2 GHz. Generally the largest improvement in IP3 performance is obtained at lower frequencies with a marginal improvement in IP3 performance occurring at higher frequencies.

Figure 20:
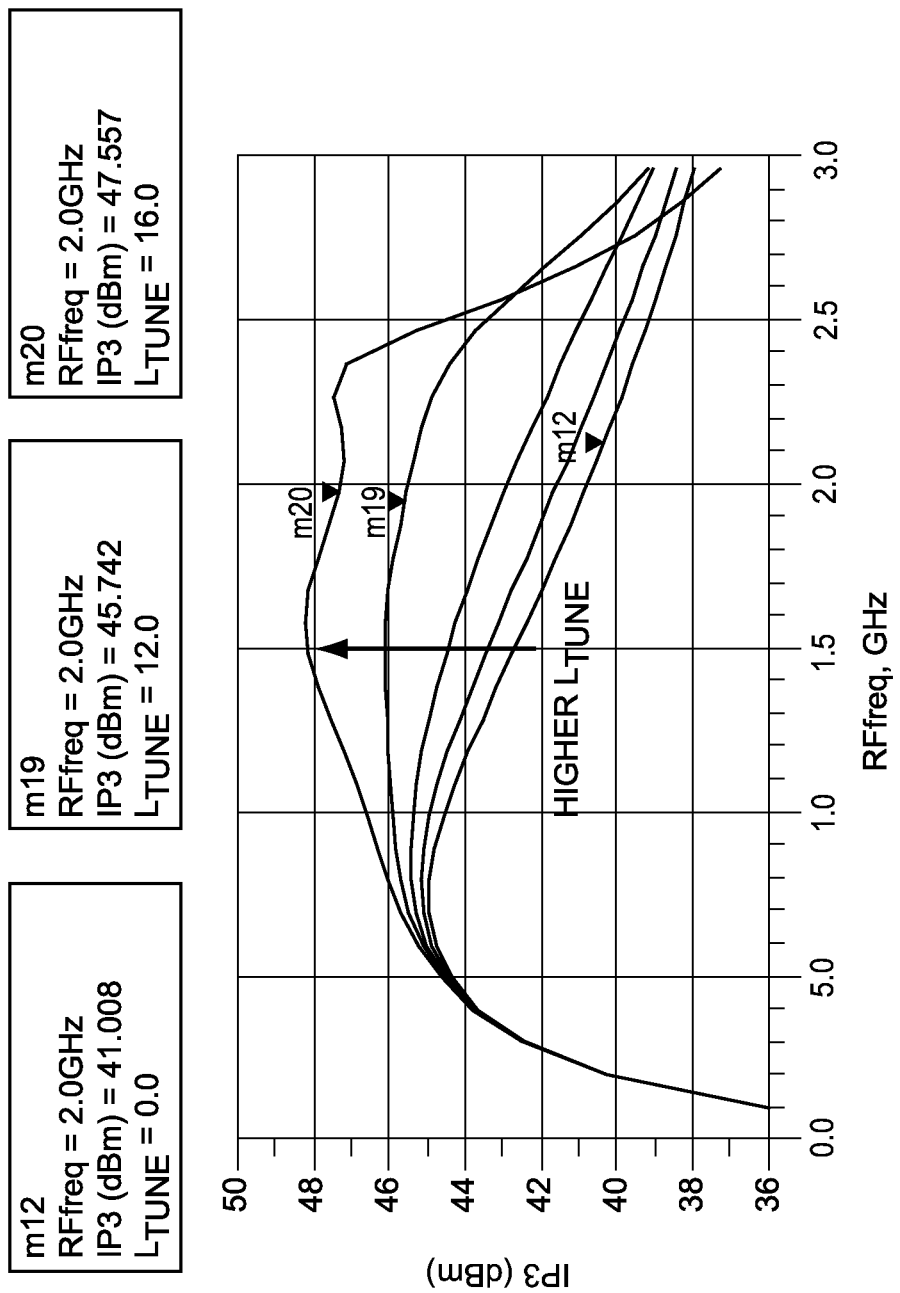
FIG. 20 is a graph showing IP3 simulations for the RLC type tuning network of FIG. 18 having swept inductance values for the tuning inductor.

FIG. 20 is a graph showing IP3 simulations for the RLC type tuning network of FIG. 18 having swept inductance values for the tuning inductor $L_{TUNE}$. The graph in FIG. 20 illustrates that by fixing the resistance of $R_{TUNE}$ to a predetermined value, and then sweeping $L_{TUNE}$, the higher 2 GHz frequency IP3 may be improved significantly. In this exemplary case, an $L_{TUNE}$ having an inductance value of 12 nH may yield a higher performance than an inductance value of 16 nH. This is due to a more gradual IP3 roll off. Moreover, the lower inductance value would be less sensitive to process and temperature variations. Further still, in this exemplary case, the IP3 performance improvement over the linear FET feedback amplifier 28 (FIGS. 6 and 8) without $L_{TUNE}$ is as high as 6.5 dB.

Figure 21:
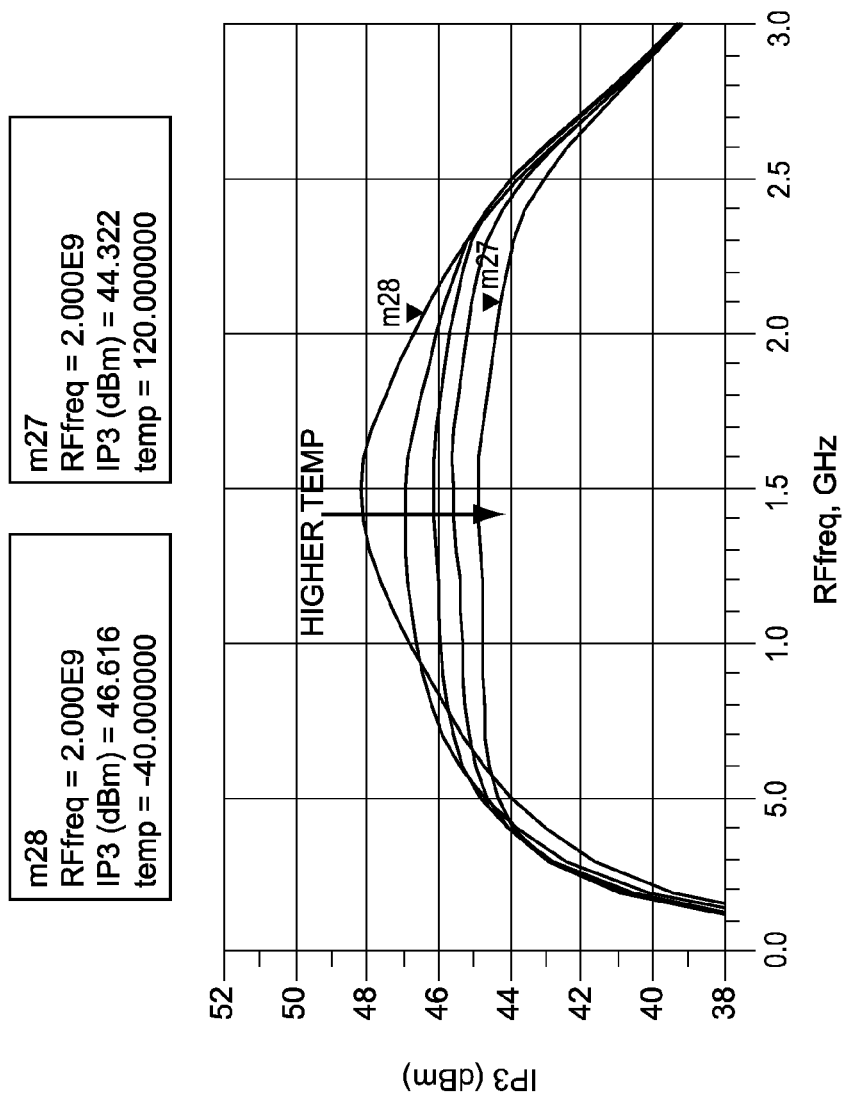
FIG. 21 is a graph showing IP3 simulations for the RLC type tuning network of FIG. 18 with operation swept over a temperature from −40° C. to 120° C.

FIG. 21 is a graph showing IP3 simulations for the RLC type tuning network 48 (FIG. 18) with operation being swept over a temperature range that extends from −40° C. to 120° C. The graph of FIG. 21 shows that the enhanced IP3 response is well behaved over a wide temperature range in an exemplary case wherein the tuning resistor $R_{TUNE}$ is set to a resistance of 200 ohms and the tuning inductor $L_{TUNE}$ is set to 12 nH. Thus, a practical design using typical resistance and inductance values will have a variation in IP3 performance that is less than 2.5 dB over a 160° C. temperature range.

Figure 22:
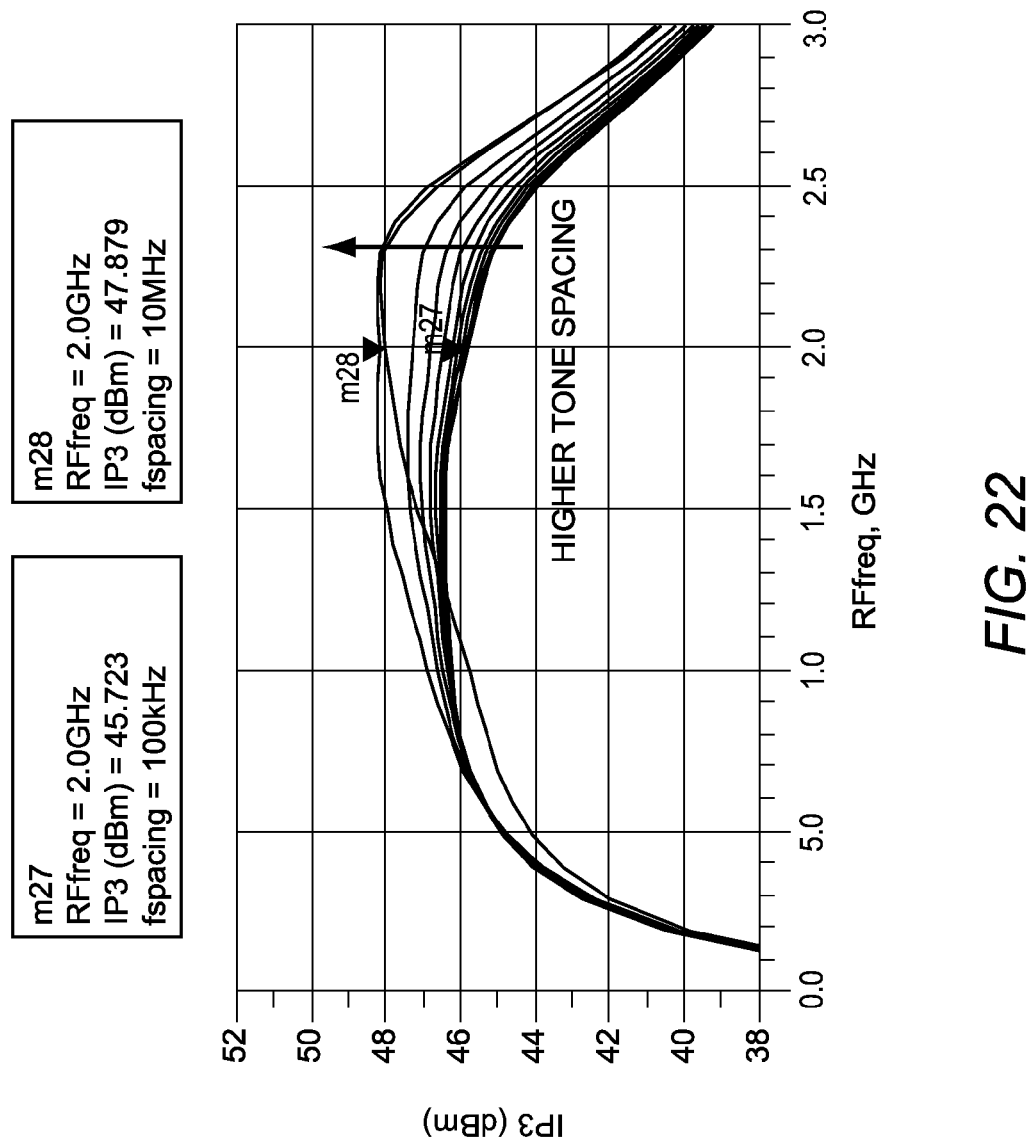
FIG. 22 is a graph showing IP3 response over a separation frequency of a two tone IP3 simulation for the RLC type tuning network of FIG. 18.

FIG. 22 is a graph showing IP3 response over a separation frequency of a two tone IP3 simulation for the RLC type tuning network of FIG. 18. As a result, the RLC type tuning network 48 (FIG. 18) is suitable for improving the IP3 performance during the operation of complex modulation schemes such as wideband code division multiple access (WCDMA).

Figure 23:
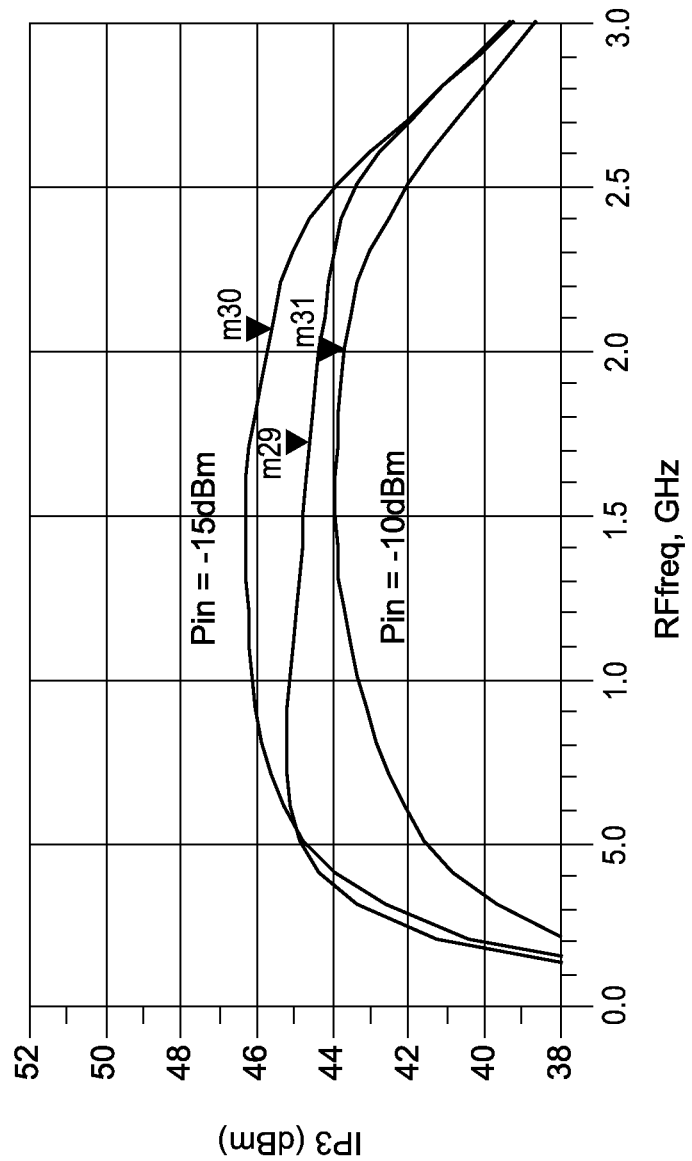
FIG. 23 is a graph showing that the RLC type tuning network of FIG. 18 has a fundamental broadband linearization over a wide dynamic range.

FIG. 23 is a graph showing that the RLC type tuning network 48 (FIG. 18) has a fundamental broadband linearization over a wide dynamic range. Furthermore, in the exemplary case wherein the tuning resistor $R_{TUNE}$ is set to a resistance of 200 ohms and the tuning inductor $L_{TUNE}$ is set to 12 nH, the enhanced IP3 response is well behaved over a 10 dB power range. As such, the graph of FIG. 23 demonstrates that the RLC type tuning network 48 (FIG. 18) does not employ a narrow band and narrow power level cancellation effect, but instead produces a fundamental broadband linearization over a wide dynamic range.

Figure 24:
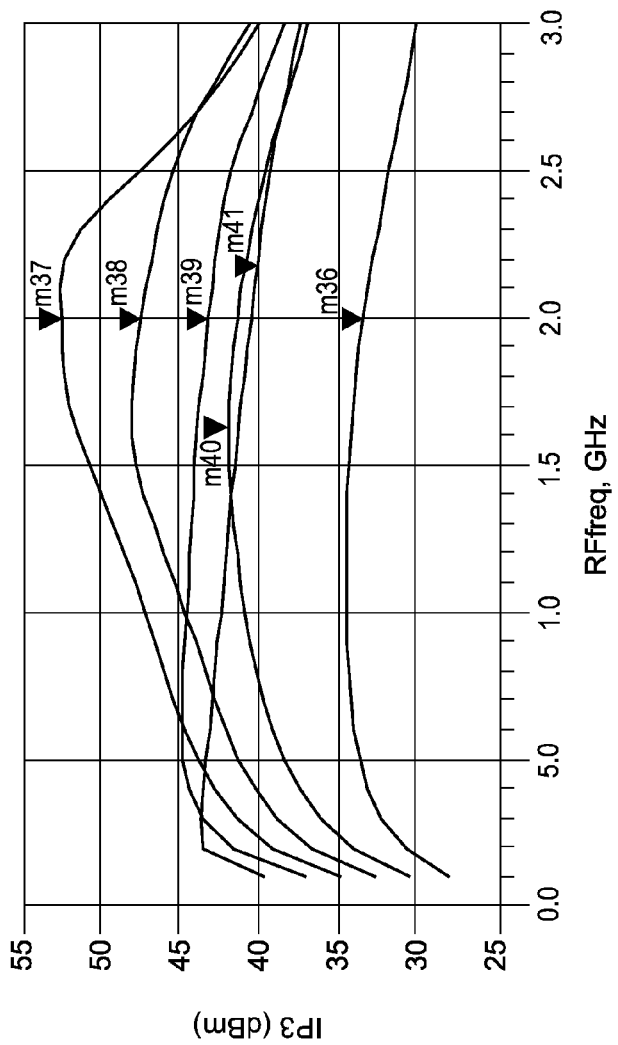
FIG. 24 is a graph showing preferred feedback resistor ratios for various desired IP3 values for given frequencies.

FIG. 24 is a graph showing preferred feedback resistor ratios for various desired IP3 values for given frequencies. The graph also illustrates a desired resistor ratio ($R_{FB2}/(R_{FB1}+R_{FB2})$) for the feedback coupling network 38, which sets the bias network feedback signal that passes back to the input, resulting in a desired IP3 response at a given frequency. A resistor ratio of 1 indicates that a relatively small amount of feedback signal will be passed back to the input of the Darlington transistor pair 30 (FIG. 18), thereby minimizing an improvement in linearity for the linear feedback FET amplifier 44 (FIG. 18). A ratio of 0.5 indicates that a relatively large amount feedback signal will be passed back to the input of the Darlington transistor pair 30. An exemplary operational frequency of 2 GHz and a resistor ratio of 0.7 will produce a desirable IP3 performance.

Figure 25:
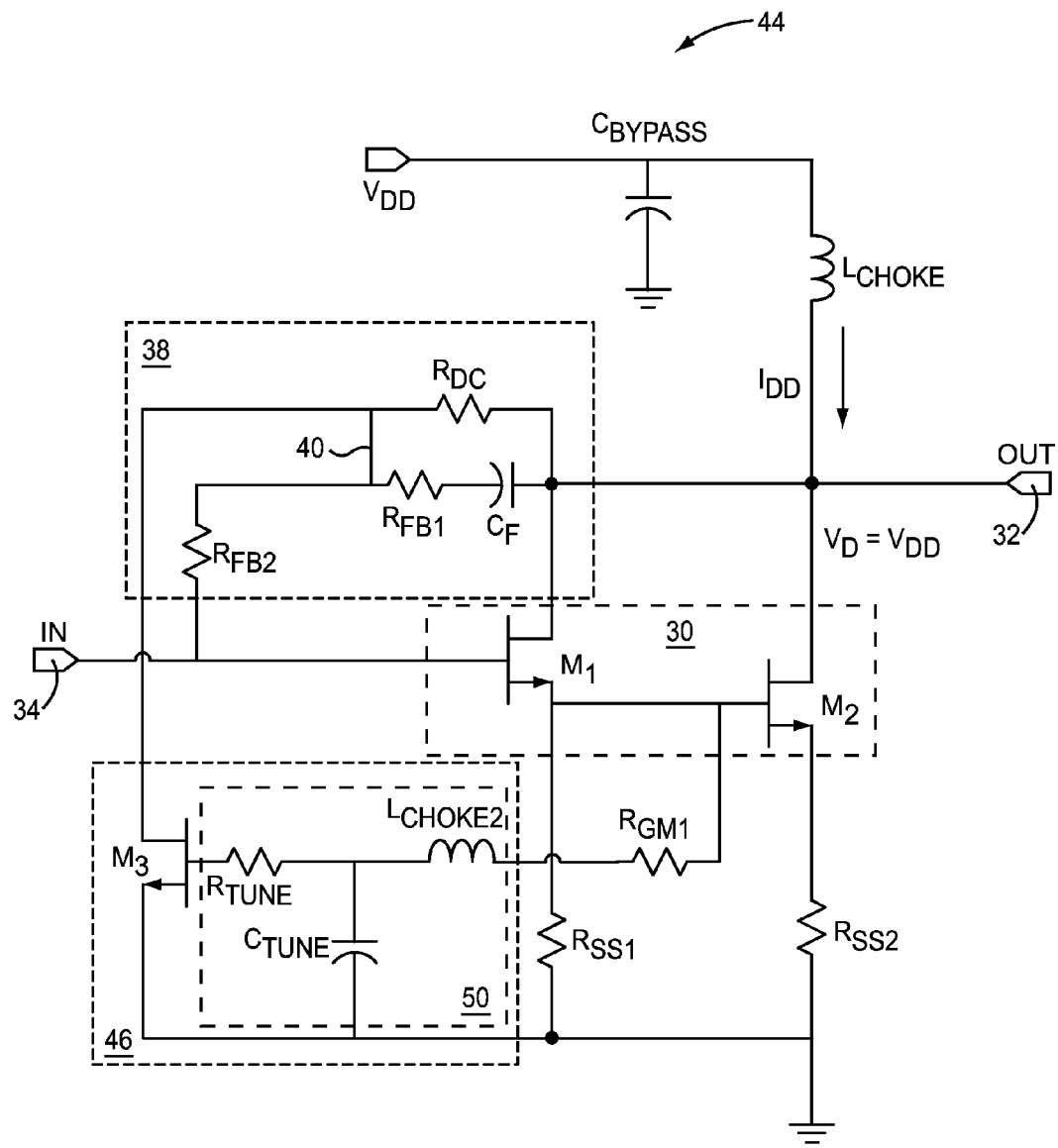
FIG. 25 is a circuit diagram of a second embodiment of a linear FET feedback amplifier employing an RLC type tuning network with a choke inductor.

FIG. 25 is a circuit diagram of a second embodiment of a linear FET feedback amplifier employing an RLC type tuning network with a choke inductor. In this embodiment, an RLC type tuning network 50 includes a choke inductor $L_{CHOKE2}$ that is in series with filter resistor $R_{GM1}$. This is in contrast to having the inductor $L_{TUNE}$ in series with the tuning resistor $R_{TUNE}$ as employed in the RLC type tuning network 48 (FIG. 18). As a result, an improvement in IP3 performance by tuning $L_{CHOKE2}$ is not as great as tuning $L_{TUNE}$ of the RLC type tuning network 48. This lower improvement in IP3 performance is illustrated in simulation results shown in FIG. 26 and FIG. 27.

Figure 26:
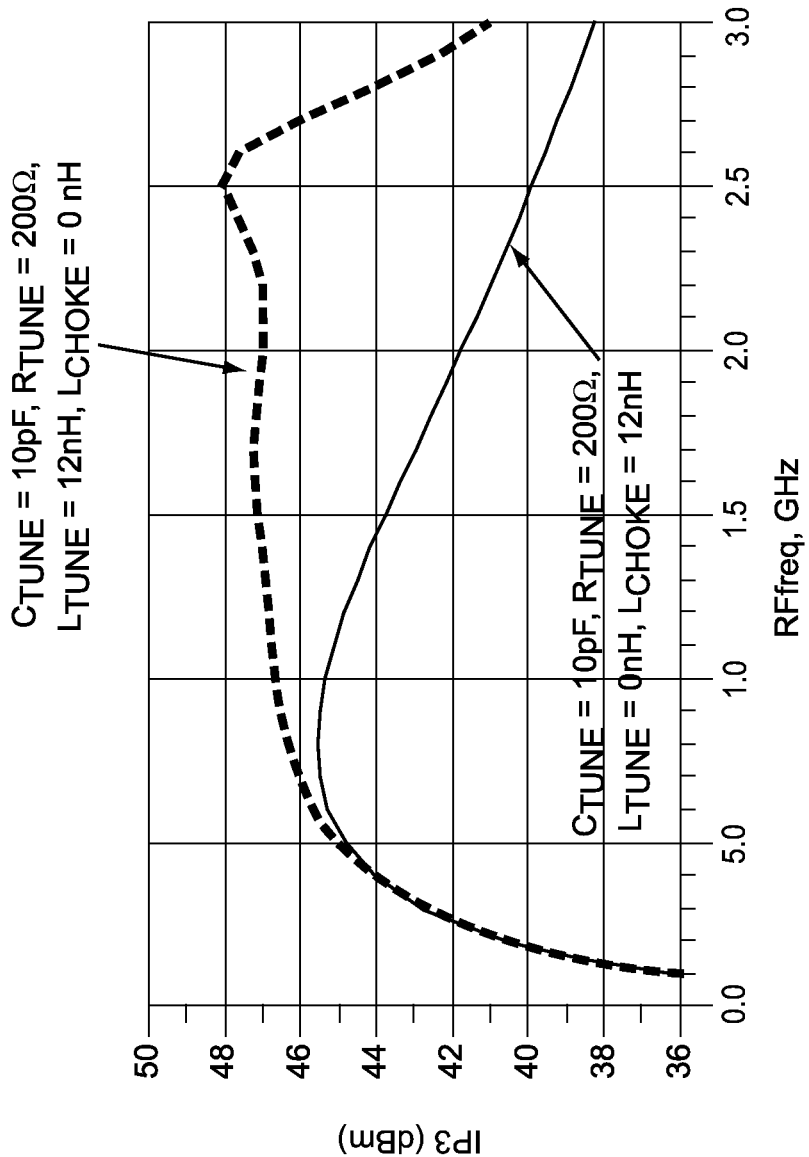
FIG. 26 is a graph of IP3 performance between employing the tuning inductor of the RLC type tuning network of FIG. 18 and the choke inductor of the RLC type tuning network of FIG. 25.

FIG. 26 is a graph of IP3 performance when employing the tuning inductor $L_{TUNE}$ of the RLC type tuning net work of FIG. 18 and the choke inductor $L_{CHOKE2}$ of the RLC type tuning network of FIG. 25. In particular, FIG. 26 illustrates that the tuning inductor $L_{TUNE}$ has a relatively greater impact on improving IP3 than the choke inductor $L_{CHOKE2}$ does. Therefore, the placement of any inductor is critical to IP3 performance. In this exemplary case, the tuning inductor $L_{TUNE}$ in series with the tuning resistor $R_{TUNE}$ in the RLC type tuning network 48 (FIG. 18) provides a relatively large IP3 performance advantage over the RLC type tuning network 50 (FIG. 25), which has the choke inductor $L_{CHOKE2}$ in series with the filter resistor $R_{GM1}$.

Figure 27:
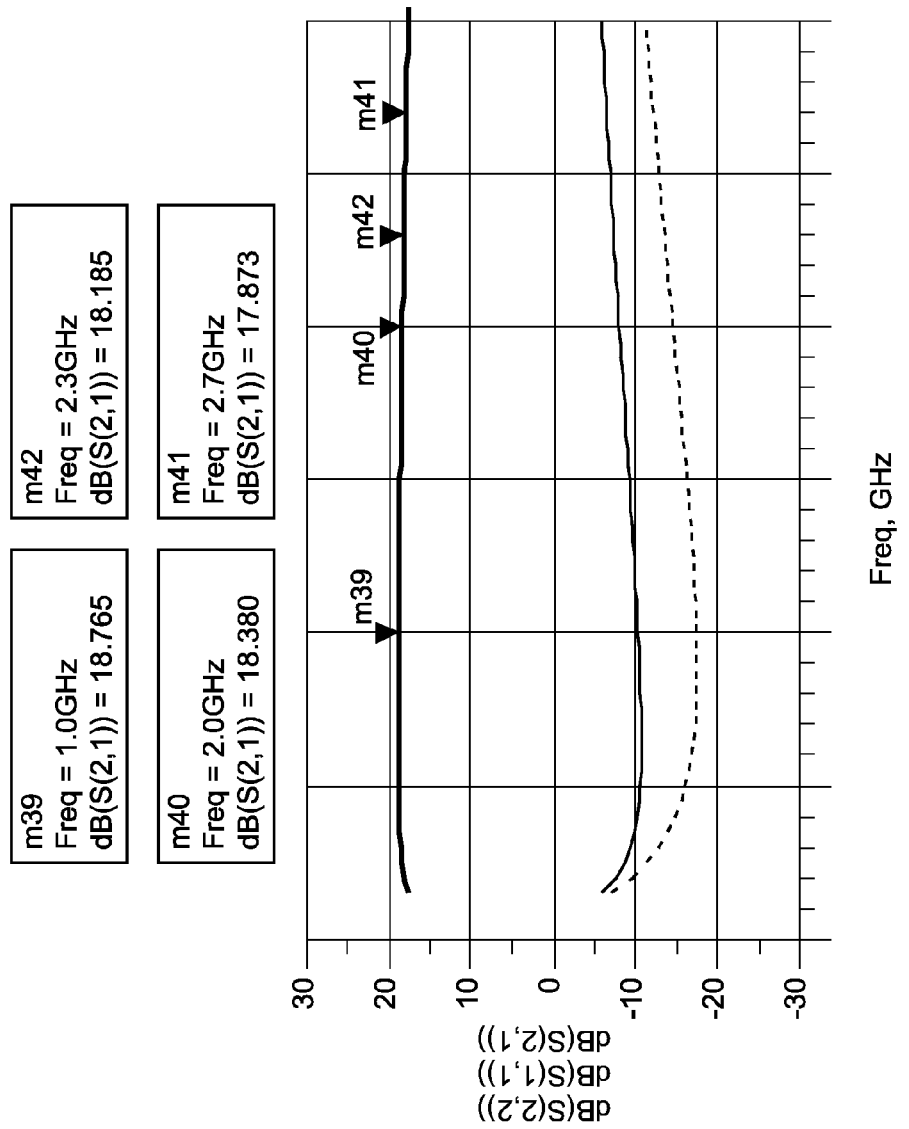
FIG. 27 is a graph depicting nominal S-parameter characteristics for the present embodiments.

FIG. 27 is a graph depicting nominal S-parameter characteristics for the present embodiments. In particular, the graph of FIG. 27 shows nominal broadband S-parameter characteristics. Specifically, the gain and return-loss characteristics indicate that a multi-octave amplification capability exists for both the first and second embodiments of the linear FET feedback amplifier 44.

Figure 28:
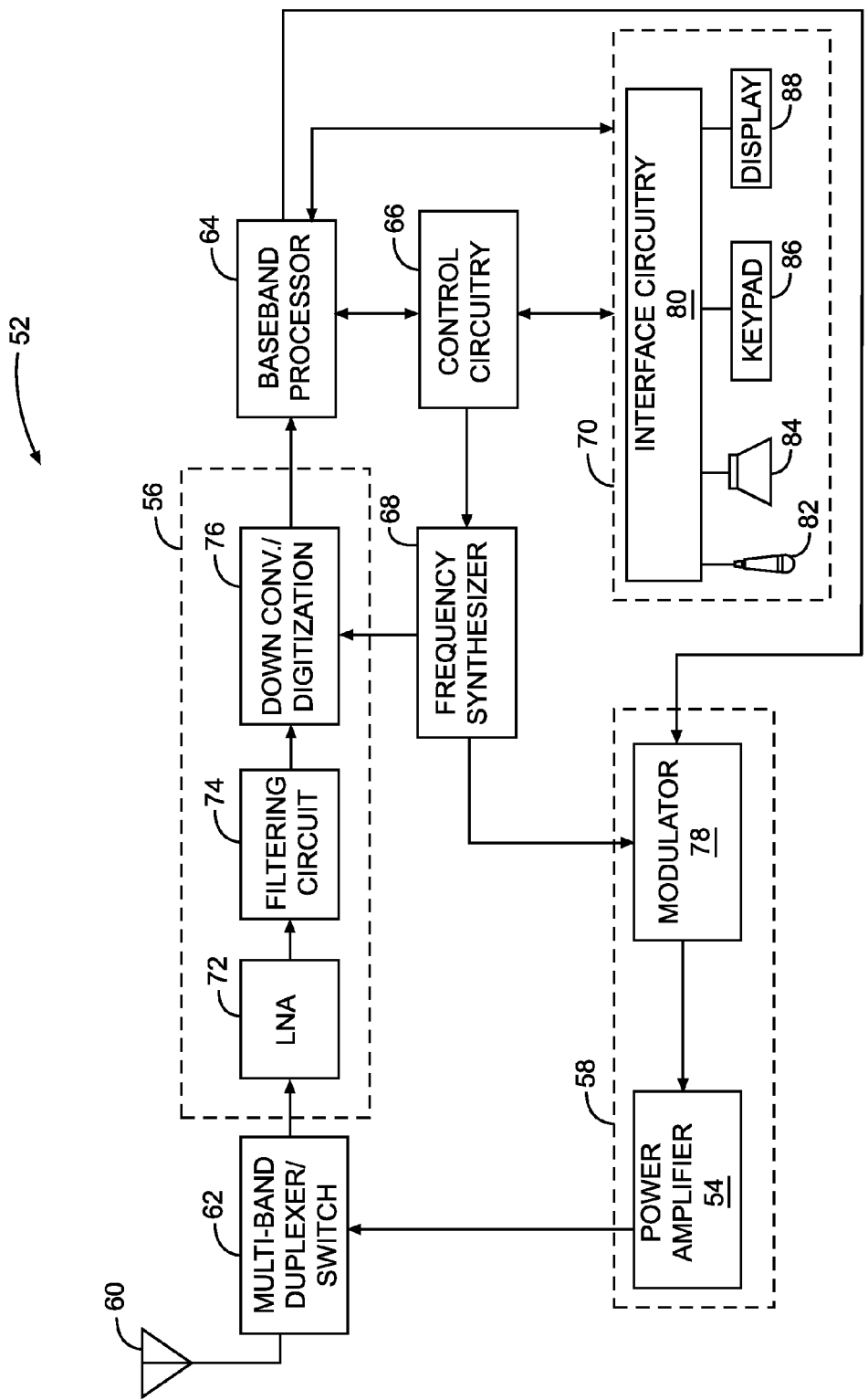
FIG. 28 depicts user equipment (UE) in the form of a mobile terminal that incorporates embodiments of the linear FET feedback amplifier of the present disclosure.

FIG. 28 depicts the basic architecture of user equipment (UE) in the form of a mobile terminal 52 that incorporates an embodiment of the linear FET feedback amplifier 28 of FIG. 7. In particular, the linear FET feedback amplifier 28 is usable in power amplifier circuitry 54 of the mobile terminal 52. The mobile terminal 52 may include a receiver front end 56, a radio frequency (RF) transmitter section 58, an antenna 60, a duplexer or switch 62, a baseband processor 64, control circuitry 66, a frequency synthesizer 68, and an interface 70. The receiver front end 56 receives information bearing radio frequency signals from one or more remote transmitters provided by a base station (not shown). The linear FET feedback amplifier 28 is also usable in a low noise amplifier (LNA) 72 that amplifies a received signal. A filter circuit 74 minimizes broadband interference in the received signal, while down conversion and digitization circuitry 76 down converts the filtered, received signal to an intermediate or baseband frequency signal, which is then digitized into one or more digital streams. The down conversion and digitization circuitry 76 may include an intermediate frequency (IF) amplifier comprised of the linear FET feedback amplifier 28. The receiver front end 56 typically uses one or more mixing frequencies generated by the frequency synthesizer 68. The baseband processor 64 processes the digitized received signal to extract the information or data bits conveyed in the received signal.

This processing typically comprises demodulation, decoding, and error correction operations. As such, the baseband processor 64 is generally implemented in one or more digital signal processors (DSPs).

On the transmit side, the baseband processor 64 receives digitized data, which may represent voice, data, or control information, from the control system 66, which it encodes for transmission. The encoded data is output to the RF transmitter section 58, where it is used by a modulator 78 to modulate a carrier signal that is at a desired transmit frequency. The power amplifier circuitry 54 amplifies the modulated carrier signal to a level appropriate for transmission, and delivers the amplified and modulated carrier signal to the antenna 60 through the duplexer or switch 62.

A user may interact with the mobile terminal 52 via the interface 70, which may include interface circuitry 80 associated with a microphone 82, a speaker 84, a keypad 86, and a display 88. The interface circuitry 80 typically includes analog-to-digital converters, digital-to-analog converters, amplifiers, and the like. Additionally, it may include a voice encoder/decoder, in which case it may communicate directly with the baseband processor 64. The microphone 82 will typically convert audio input, such as the user's voice, into an electrical signal, which is then digitized and passed directly or indirectly to the baseband processor 64. Audio information encoded in the received signal is recovered by the baseband processor 64, and converted by the interface circuitry 80 into an analog signal suitable for driving the speaker 84. The keypad 86 and the display 88 enable the user to interact with the mobile terminal 52, input numbers to be dialed, address book information, or the like, as well as monitor call progress information.

Those skilled in the art will recognize improvements and modifications to the preferred embodiments of the present disclosure. All such improvements and modifications are considered within the scope of the concepts disclosed herein and the claims that follow.

What is claimed is:

1. A circuit comprising:
    a Darlington transistor pair having an input transistor and an output transistor configured to generate an output signal at an output node in response to an input signal received through an input node;
    a frequency bias feedback network communicatively coupled between the output transistor and the input node for providing biasing to the Darlington transistor pair as well as for adjusting at least one characteristic of an amplified version of the input signal that passes through the input transistor and into the frequency bias feedback network, wherein the frequency bias feedback network comprises:
        a bias transistor coupled between a feedback coupling network and a fixed voltage node; and
        a resistor-inductor-capacitor (RLC) tuning network that is tunable within a range that increases a third order intercept point (IP3) to improve an upper frequency band linearity; and
    the feedback coupling network coupled between the output node and the input node for feeding back to the input node a portion of the amplified version of the input signal that passes through the input transistor.

2. The circuit of claim 1 wherein the at least one characteristic is amplitude.

3. The circuit of claim 1 wherein the at least one characteristic is phase.

4. The circuit of claim 1 wherein the at least one characteristic is amplitude and phase.

5. The circuit of claim 1 wherein the RLC tuning network includes a resistor, an inductor, and a capacitor wherein the resistor and inductor are coupled in series between a control terminal of the bias transistor and the capacitor.

6. The circuit of claim 5 wherein the capacitor is coupled in parallel with the resistor and inductor.

7. The circuit of claim 1 wherein the portion of the amplified version of the input signal that passes through the input transistor is phase and amplitude adjusted.

8. The circuit of claim 1 wherein the output signal is fed back to the input node via the feedback coupling network.

9. The circuit of claim 1 wherein a resistor in the RLC tuning network is a variable resistor.

10. The circuit of claim 9 wherein the variable resistor is a field effect transistor (FET) coupled in series with a gate of the bias transistor.

11. The circuit of claim 1 wherein a capacitor in the RLC tuning network is a variable capacitor.

12. The circuit of claim 11 wherein the variable capacitor is a varactor diode.

13. The circuit of claim 1 wherein the RLC tuning network includes a variable resistor that changes resistance in response to a control signal and a variable capacitor that changes capacitance in response to a second control signal.

14. The circuit of claim 13 wherein the variable resistor is tunable to a resistance value and the variable capacitor is tunable to a capacitance value that suppress intermodulation (IM) distortion at the output node of the output transistor.

15. The circuit of claim 1 wherein the feedback coupling network includes a pair of split feedback resistors coupled at a tap point that is communicatively coupled to the bias transistor.

16. The circuit of claim 15 wherein a resistance ratio of the pair of split feedback resistors is adjustable to maximize a coupling of radio frequency (RF), intermediate frequency (IF), and direct current (DC) signals to the input node.

17. The circuit of claim 1 wherein the RLC tuning network is tunable to suppress IM distortion at the output node.

18. A mobile terminal comprising:
    an antenna;
    a duplexer/switch coupled to the antenna;
    amplifier circuitry selectively coupled to the antenna through the duplexer/switch, the amplifier circuitry comprising:
        a Darlington transistor pair having an input transistor and an output transistor configured to generate an output signal at an output node in response to an input signal received through an input node;
        a frequency bias feedback network communicatively coupled between the output transistor and the input node for providing biasing to the Darlington transistor pair as well as for adjusting at least one characteristic of an amplified version of the input signal that passes through the input transistor and into the frequency bias feedback network;
        a feedback coupling network coupled between the output node and the input node for feeding back to the input node a portion of the amplified version of the input signal that passes through the input transistor;
        a bias transistor coupled between the feedback coupling network and a fixed voltage node; and
    a resistor-inductor-capacitor (RLC) tuning network that is tunable within a range that increases a third order intercept point (IP3) to improve an upper frequency band linearity.

19. The mobile terminal of claim 18 wherein the at least one characteristic is amplitude.

20. The mobile terminal of claim 18 wherein the at least one characteristic is phase.

21. The mobile terminal of claim 18 wherein the at least one characteristic is amplitude and phase.

22. The mobile terminal of claim 18 wherein the RLC tuning network includes a resistor, an inductor, and a capacitor wherein the resistor and inductor are coupled in series between a control terminal of the bias transistor and the capacitor.

23. The mobile terminal of claim 22 wherein the capacitor is coupled in parallel with the resistor and the inductor.

24. The mobile terminal of claim 18 wherein the portion of the amplified version of the input signal that passes through the input transistor is phase and amplitude adjusted.

25. The mobile terminal of claim 18 wherein the output signal is fed back to the input node via the feedback coupling network.

26. The mobile terminal of claim 18 further including a radio frequency (RF) transmitter section that includes the amplifier circuitry and wherein the amplifier circuitry is power amplifier circuitry.

27. The mobile terminal of claim 18 further including a receiver front end that includes the amplifier circuitry and wherein the amplifier circuitry comprises a low noise amplifier (LNA).

28. The mobile terminal of claim 18 further including a receiver front end that includes the amplifier circuitry and wherein the amplifier circuitry comprises an intermediate frequency (IF) amplifier.

29. The mobile terminal of claim 22 wherein the resistor is a FET coupled in series with a gate of the bias transistor.

30. The mobile terminal of claim 18 wherein the RLC tuning network includes a resistor having a fixed resistance value and a variable capacitor that changes capacitance in response to a control signal.

31. The mobile terminal of claim 30 wherein the variable capacitor is a varactor diode.

32. The mobile terminal of claim 18 wherein the RLC tuning network includes a variable resistor that changes resistance in response to a control signal and a variable capacitor that changes capacitance in response to a second control signal.

33. The mobile terminal of claim 32 wherein the variable resistor is tunable to a resistance value and the variable capacitor is tunable to a capacitance value that suppresses IM distortion at the output node of the output transistor.

34. The mobile terminal of claim 18 wherein the feedback coupling network includes a pair of split feedback resistors coupled at a tap point that is communicatively coupled to the bias transistor.

35. The mobile terminal of claim 34 wherein a resistance ratio of the pair of split feedback resistors is adjustable to maximize a coupling of radio frequency (RF), intermediate frequency (IF), and direct current (DC) signals to the input node.

36. The mobile terminal of claim 18 wherein the RLC tuning network is tunable to suppress IM distortion at the output node.

37. A circuit comprising:
a Darlington transistor pair having an input transistor and an output transistor configured to generate an output signal at an output node in response to an input signal received through an input node;
a frequency bias feedback network communicatively coupled between the output transistor and the input node for providing biasing to the Darlington transistor pair as well as for adjusting a phase and amplitude of an amplified version of the input signal that passes through the input transistor and into the frequency bias feedback network, wherein the frequency bias feedback network comprises:
a bias transistor coupled between a feedback coupling network and a fixed voltage node; and
a resistor-inductor-capacitor (RLC) tuning network that is tunable within a range that increases a third order intercept point (IP3) to improve an upper frequency band linearity; and
the feedback coupling network coupled between the output node and the input node for feeding back to the input node a portion of the amplified version of the input signal that passes through the input transistor.

* * * * *